(12) United States Patent
Okabe et al.

(10) Patent No.: US 11,957,015 B2
(45) Date of Patent: Apr. 9, 2024

(54) DISPLAY DEVICE

(71) Applicant: SHARP KABUSHIKI KAISHA, Sakai (JP)

(72) Inventors: Tohru Okabe, Osaka (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 474 days.

(21) Appl. No.: 17/278,548

(22) PCT Filed: Sep. 25, 2018

(86) PCT No.: PCT/JP2018/035365
§ 371 (c)(1),
(2) Date: Mar. 22, 2021

(87) PCT Pub. No.: WO2020/065710
PCT Pub. Date: Apr. 2, 2020

(65) Prior Publication Data
US 2021/0351263 A1    Nov. 11, 2021

(51) Int. Cl.
*H01L 33/00* (2010.01)
*H10K 50/844* (2023.01)
*H10K 59/131* (2023.01)
*H10K 59/122* (2023.01)
(Continued)

(52) U.S. Cl.
CPC ......... *H10K 59/131* (2023.02); *H10K 50/844* (2023.02); *H10K 59/122* (2023.02); *H10K 59/124* (2023.02); *H10K 2102/311* (2023.02)

(58) Field of Classification Search
CPC ............. H10K 59/123; H10K 59/1201; H10K 59/1315; H10K 59/131; H10K 50/844; H10K 2102/311; H10K 59/122; H10K 59/124; H10K 59/35; H10K 59/00; H10K 50/818; H10K 50/826; H10K 50/856; H10K 50/8428; H10K 71/00; H10K 77/111; H10K 2102/101; H10K 2102/00; G09F 9/30;
(Continued)

(56) References Cited

U.S. PATENT DOCUMENTS 7,956,945 B2 * 6/2011 Kim .................. G02F 1/136204
                                                           349/40
9,184,221 B2 * 11/2015 Jinbo ................ H01L 29/66969
9,741,278 B2 *  8/2017 Kang .................... H10K 71/70
(Continued)

FOREIGN PATENT DOCUMENTS

JP    2014086415 A       5/2014
KR    2017090382 A  *    8/2017    ......... H01L 27/3246
(Continued)

*Primary Examiner* — Samuel Park
(74) *Attorney, Agent, or Firm* — ScienBiziP, P.C.

(57) ABSTRACT

A lead wiring line is provided in a frame region to extend therein while intersecting with a frame-shaped dam wall, is formed of a same material and in a same layer as each of a plurality of display wiring lines in which a first metal layer, a second metal layer, and a third metal layer are layered in sequence, is electrically connected to the plurality of display wiring lines on a display region side, and is electrically connected to a terminal on a terminal portion side. The third metal layer is provided to cover a side surface of the first metal layer, and a side surface and an upper face of the second metal layer.

18 Claims, 18 Drawing Sheets

(51) Int. Cl.
*H10K 59/124* (2023.01)
*H10K 102/00* (2023.01)

(58) Field of Classification Search
CPC ........ H05B 33/06; H05B 33/22; H05B 33/26; H05B 33/10; H05B 33/02
USPC ........ 257/21, 40, 82, 88, 184, 918, E29.147, 257/E29.139, E33.001; 438/22, 28, 34, 438/FOR. 157, FOR. 287, FOR. 416, 438/FOR. 417; 349/40, 47, 359, 428, 445
See application file for complete search history.

(56) References Cited

U.S. PATENT DOCUMENTS

| | | | | |
|---|---|---|---|---|
| 9,893,139 | B2 * | 2/2018 | Kim | H10K 77/111 |
| 10,750,621 | B2 * | 8/2020 | Inoue | H05K 3/3421 |
| 10,756,302 | B2 * | 8/2020 | Paek | H10K 50/813 |
| 2006/0113903 | A1 * | 6/2006 | Kim | H10K 59/131 |
| | | | | 313/506 |
| 2009/0101905 | A1 * | 4/2009 | Hayashi | H01L 27/124 |
| | | | | 257/59 |
| 2009/0167654 | A1 * | 7/2009 | Kim | G02F 1/1345 |
| | | | | 345/87 |
| 2014/0117330 | A1 | 5/2014 | Cho et al. | |
| 2015/0070542 | A1 * | 3/2015 | Dai | H04N 25/75 |
| | | | | 348/294 |
| 2016/0365398 | A1 * | 12/2016 | Kim | H10K 50/8426 |
| 2017/0188463 | A1 * | 6/2017 | Kim | H05K 1/028 |
| 2018/0039364 | A1 * | 2/2018 | Pan | G02F 1/13454 |
| 2018/0040672 | A1 * | 2/2018 | Park | H10K 59/88 |
| 2018/0061895 | A1 * | 3/2018 | Kim | H10K 50/13 |
| 2018/0301520 | A1 * | 10/2018 | Jin | H10K 77/111 |
| 2020/0144354 | A1 * | 5/2020 | Jeon | H10K 59/1213 |
| 2022/0180792 | A1 * | 6/2022 | Choi | G09G 3/3233 |

FOREIGN PATENT DOCUMENTS

| | | | | |
|---|---|---|---|---|
| KR | 2018014378 A | * | 2/2018 | .......... G06F 3/0412 |
| KR | 2018078571 A | * | 7/2018 | .......... G06F 3/0412 |
| WO | WO-2018128033 A1 | * | 7/2018 | ............ G06F 9/30 |

* cited by examiner

DISPLAY DEVICE

TECHNICAL FIELD

The disclosure relates to a display device.

BACKGROUND ART

In recent years, organic EL display devices in which organic electroluminescence (EL) elements are used and that are of a self-luminous type have attracted attention as a display device that can replace a liquid crystal display device. For the organic EL display device, a sealing structure is proposed to suppress degradation of the organic EL element due to penetration of, for example, moisture and oxygen. The sealing structure includes a sealing film covering the organic EL element, and the sealing film includes a layered film of an inorganic film and an organic film.

For example, PTL 1 discloses a display device including a thin film sealing layer. The thin film sealing layer has a layered structure in which an inorganic film layer formed through CVD (chemical vapor deposition) or the like, and an organic film layer formed through an ink-jet method or the like, are arranged in an alternating manner, and the thin film sealing layer covers an organic light-emitting element.

CITATION LIST

Patent Literature

PTL 1: JP 2014-86415 A

SUMMARY

Technical Problem

In a case where the organic film of the sealing film is formed by an ink-jet method as in the display device disclosed in PTL 1, a dam wall for damming up the ink to serve as the organic film needs to be provided in a frame region around a display region in which the organic EL element is provided. An organic EL display device includes, for example, a resin substrate, a thin film transistor (TFT) layer provided on the resin substrate, and an organic EL element provided on the TFT layer. The TFT layer includes a plurality of lead wiring lines provided to extend parallel to each other in a frame region, and a flattening film provided on each of the lead wiring lines and having a flat surface in a display region. The organic EL element includes, for example, a plurality of first electrodes, an edge cover, a plurality of organic EL layers, and a second electrode, which are provided in that order over the flattening film. Each lead wiring line may be damaged by a developing solution of photolithography, an etching solution used in forming the first electrodes, or the like, so that an end portion of a transverse sectional shape of each lead wiring line may be formed in an eaves shape, for example. As a result, sealing performance of the sealing film formed on each lead wiring line is degraded, which raises a risk that the organic EL element may deteriorate.

The disclosure has been made in view of the above issues, and an object thereof is to suppress damage to lead wiring lines during the manufacturing process.

Solution to Problem

To accomplish the object described above, a display device according to the disclosure includes a base substrate; a TFT layer provided on the base substrate; a plurality of light-emitting elements which is provided on the TFT layer, and in which a plurality of first electrodes, a plurality of light-emitting layers, and a second electrode common to the plurality of first electrodes are layered in sequence to constitute a display region; a sealing film which is provided to cover the plurality of light-emitting elements, and in which a first inorganic insulating film, an organic film, and a second inorganic insulating film are layered in sequence; a dam wall that is provided in a frame shape in a frame region around the display region, surrounds the display region, and overlaps with a circumferential end portion of the organic film; a terminal portion which is provided in an end portion of the frame region in such a manner as to extend in one direction, and in which a plurality of terminals is arranged; a plurality of display wiring lines which extends parallel to each other in the display region, and in each of which a first metal layer, a second metal layer, and a third metal layer are layered in sequence, and the third metal layer is provided to cover a side surface of the first metal layer, and a side surface and an upper face of the second metal layer; and a plurality of lead wiring lines that is provided in the frame region to intersect with the dam wall and extends parallel to each other, is formed of a same material and in a same layer as each of the display wiring lines, is electrically connected to the corresponding plurality of display wiring lines on the display region side, and is electrically connected to the corresponding plurality of terminals on the terminal portion side. In the display device, a plurality of source lines and a plurality of power source lines are provided as the plurality of display wiring lines; and the third metal layer is provided to cover the side surface of the first metal layer, and the side surface and the upper face of the second metal layer in each of the lead wiring lines.

Advantageous Effects of Disclosure

According to the disclosure, in each of the lead wiring lines in which the first metal layer, the second metal layer, and the third metal layer are layered in sequence, since the third metal layer is provided to cover the side surface of the first metal layer, and the side surface and the upper face of the second metal layer, it is possible to suppress damage to the lead wiring lines during the manufacturing process.

DESCRIPTION OF EMBODIMENTS

Embodiments of the disclosure will be described below in detail with reference to the drawings. Note that the disclosure is not limited to the embodiments to be described below.

First Embodiment

Figure 1:
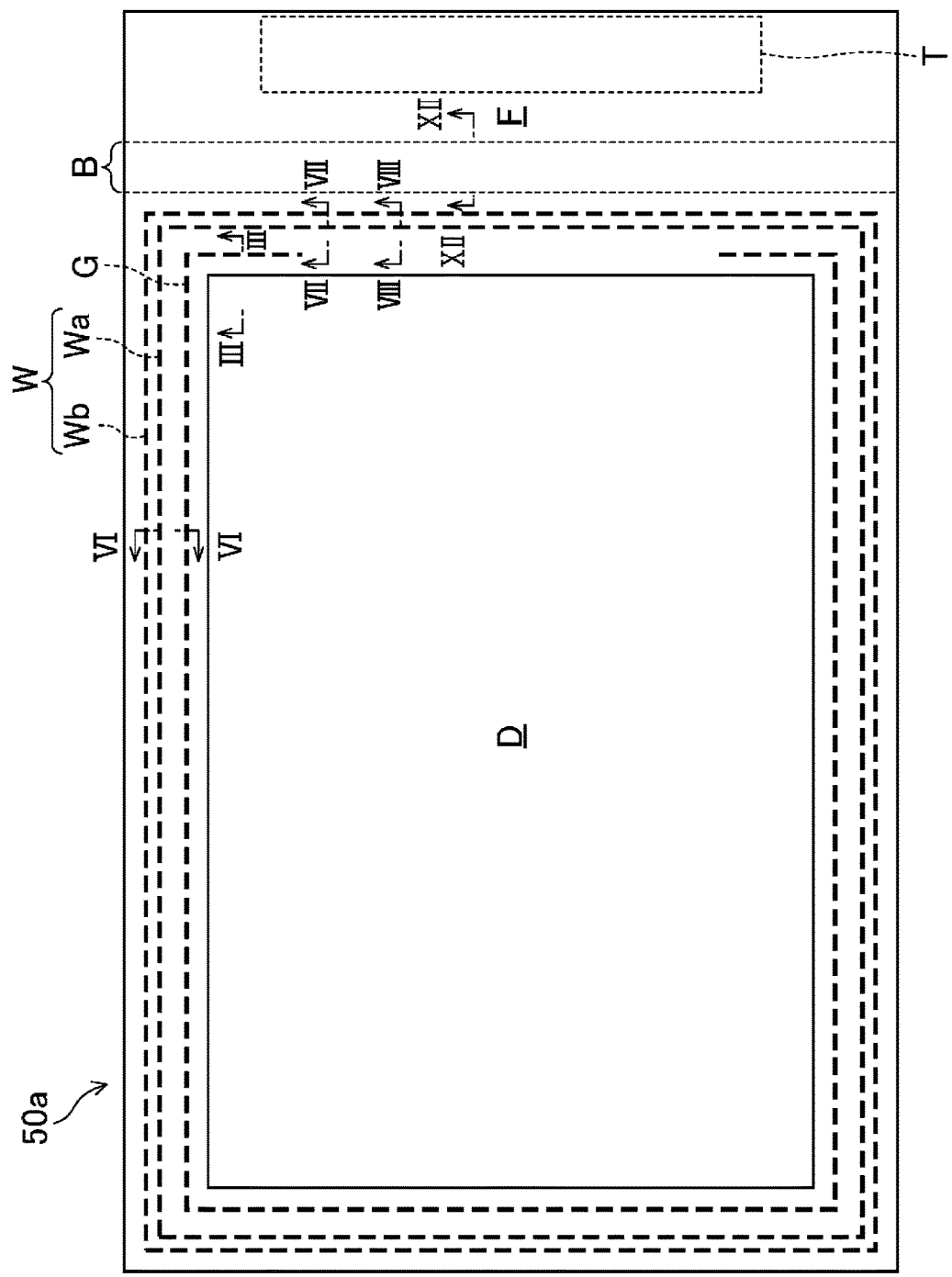
FIG. 1 is a plan view illustrating a schematic configuration of an organic EL display device according to a first embodiment of the disclosure.
Figure 2:
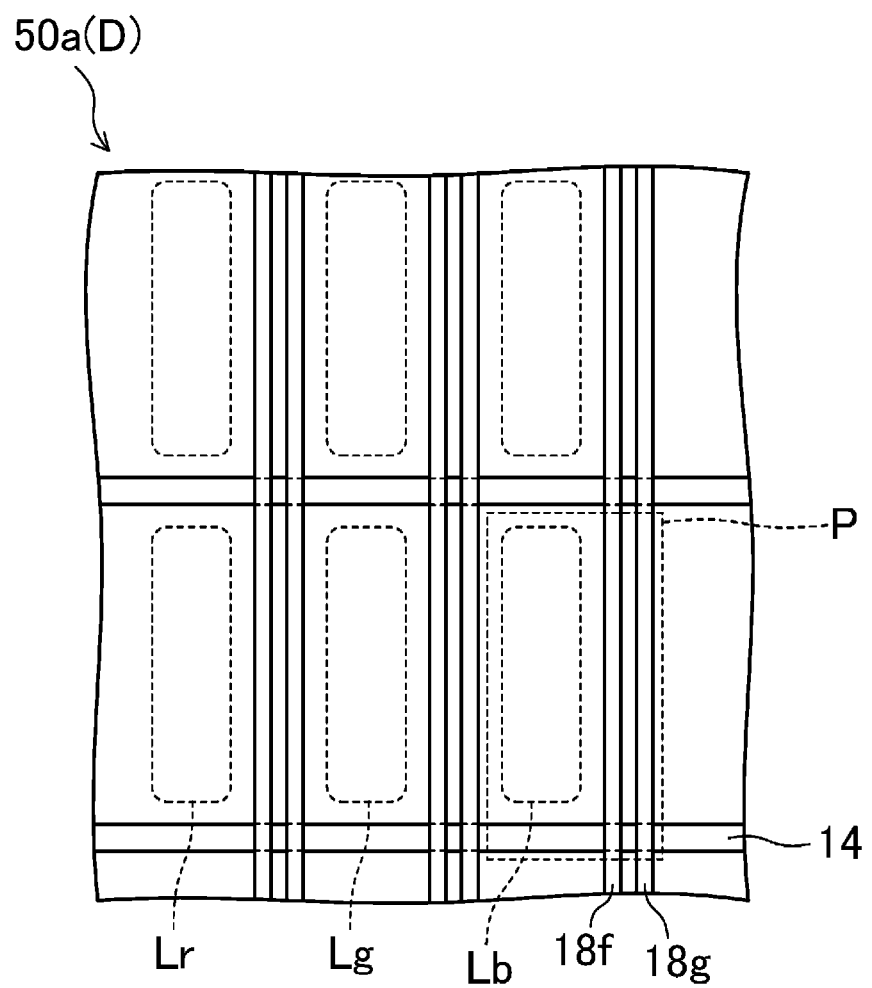
FIG. 2 is a plan view of a display region of the organic EL display device according to the first embodiment of the disclosure.
Figure 3:
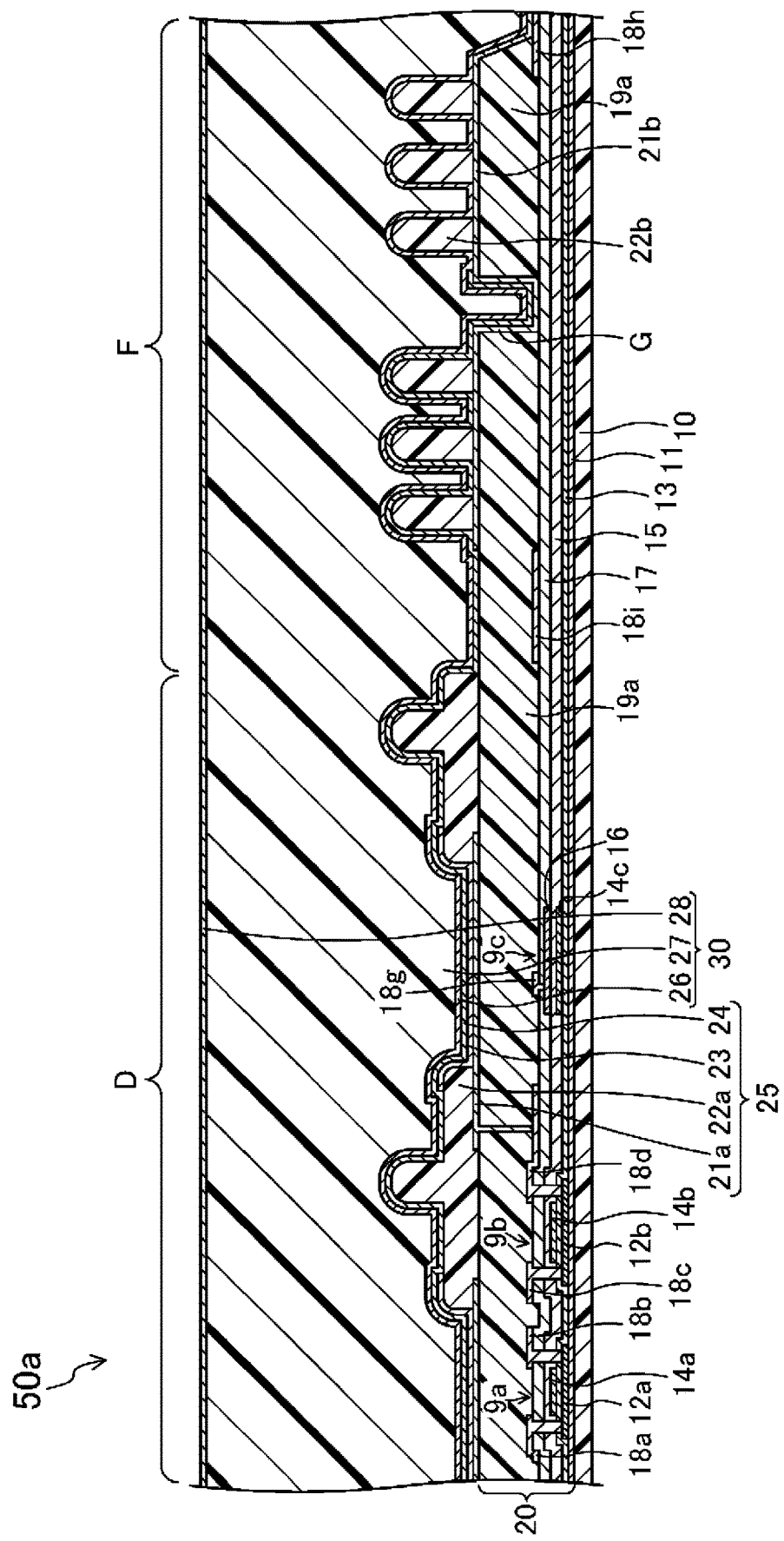
FIG. 3 is a cross-sectional view of the organic EL display device taken along a line in FIG. 1.
Figure 4:
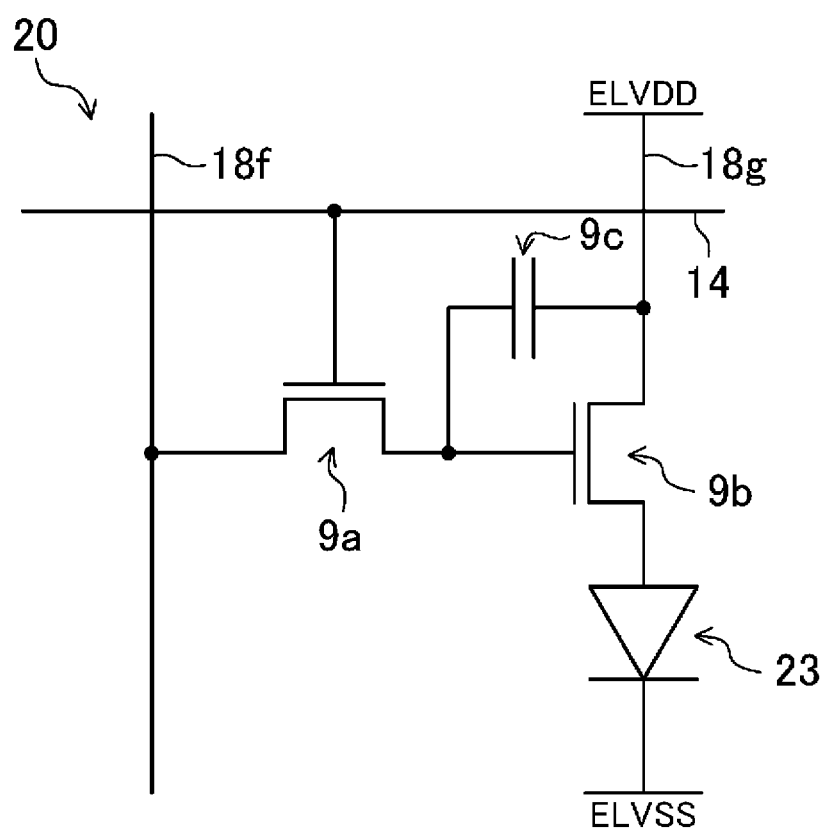
FIG. 4 is an equivalent circuit diagram of a TFT layer constituting the organic EL display device according to the first embodiment of the disclosure.
Figure 5:
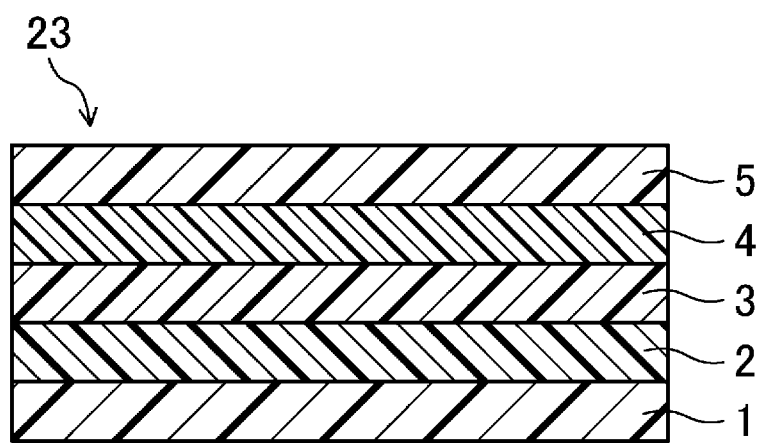
FIG. 5 is a cross-sectional view of an organic EL layer configuring the organic EL display device according to the first embodiment of the disclosure.
Figure 6:
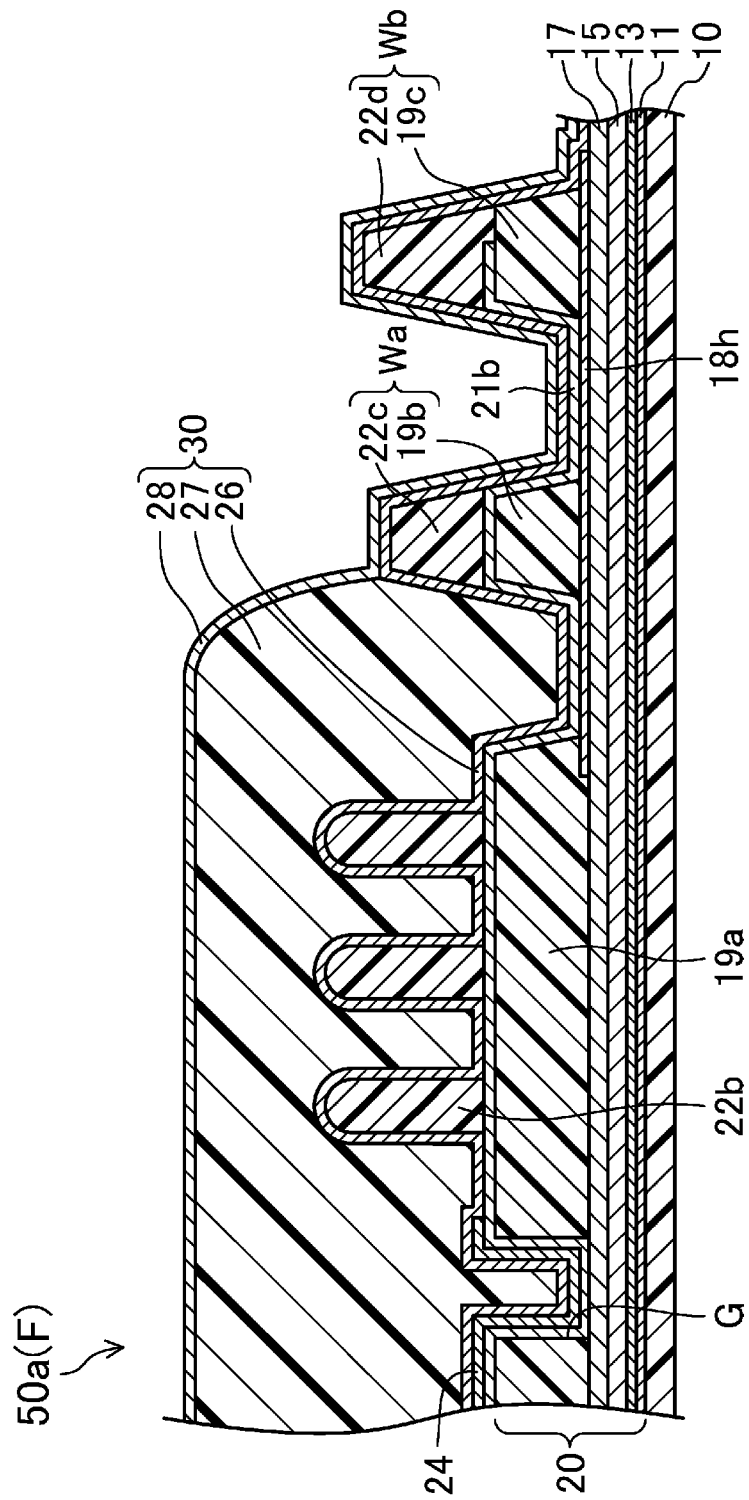
FIG. 6 is a cross-sectional view of a frame region of the organic EL display device taken along a line VI-VI in FIG. 1.
Figure 7:
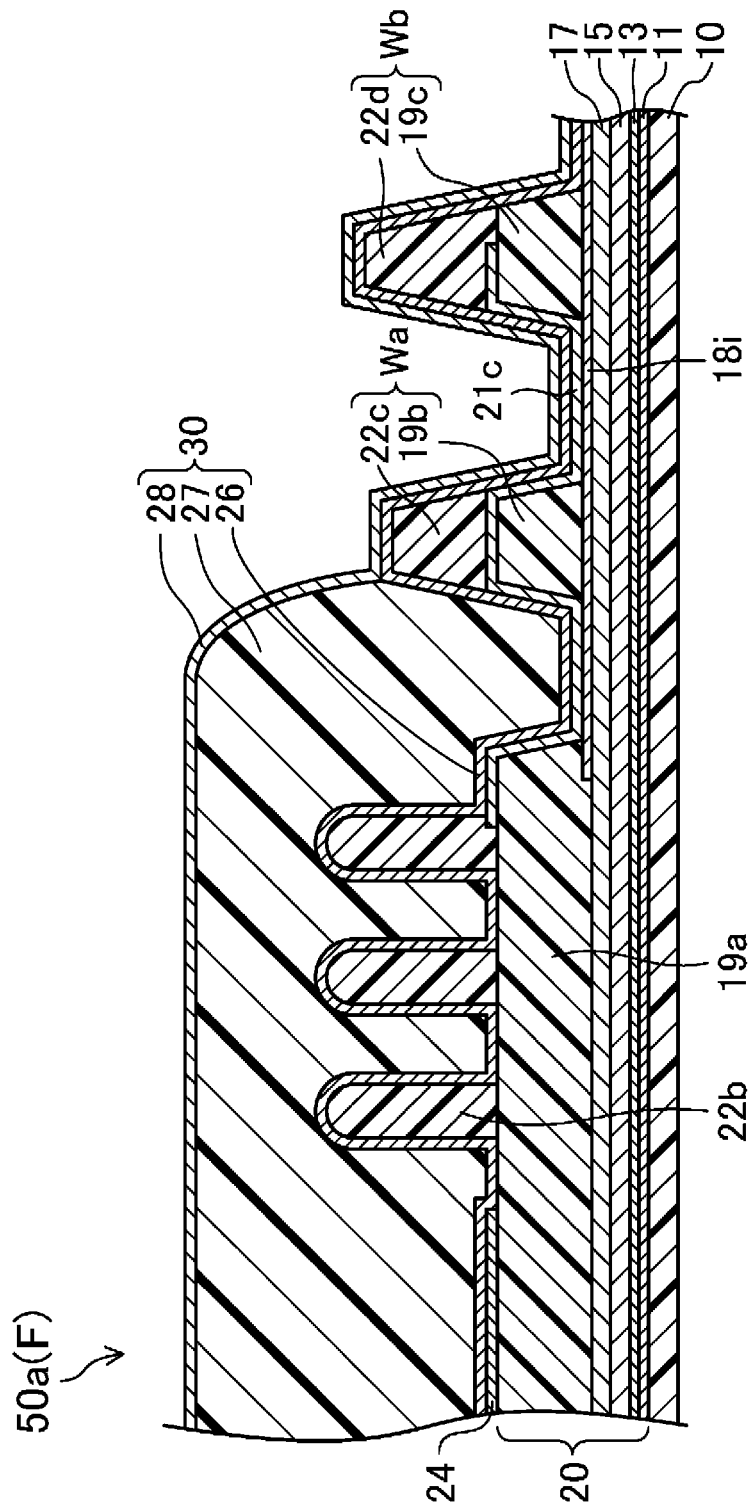
FIG. 7 is a cross-sectional view of a frame region of the organic EL display device taken along a line VII-VII in FIG. 1.
Figure 8:
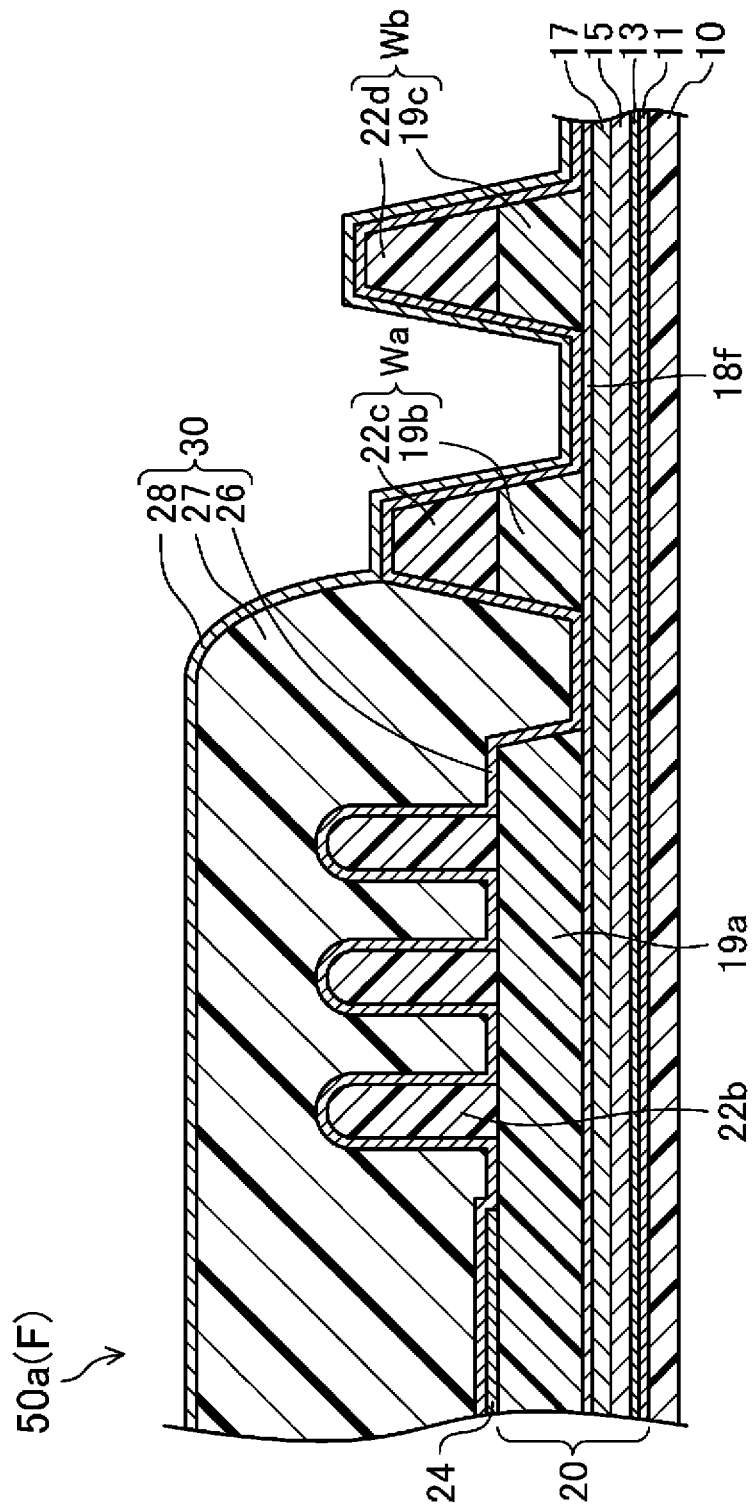
FIG. 8 is a cross-sectional view of a frame region of the organic EL display device taken along a line VIII-VIII in FIG. 1.
Figure 9:
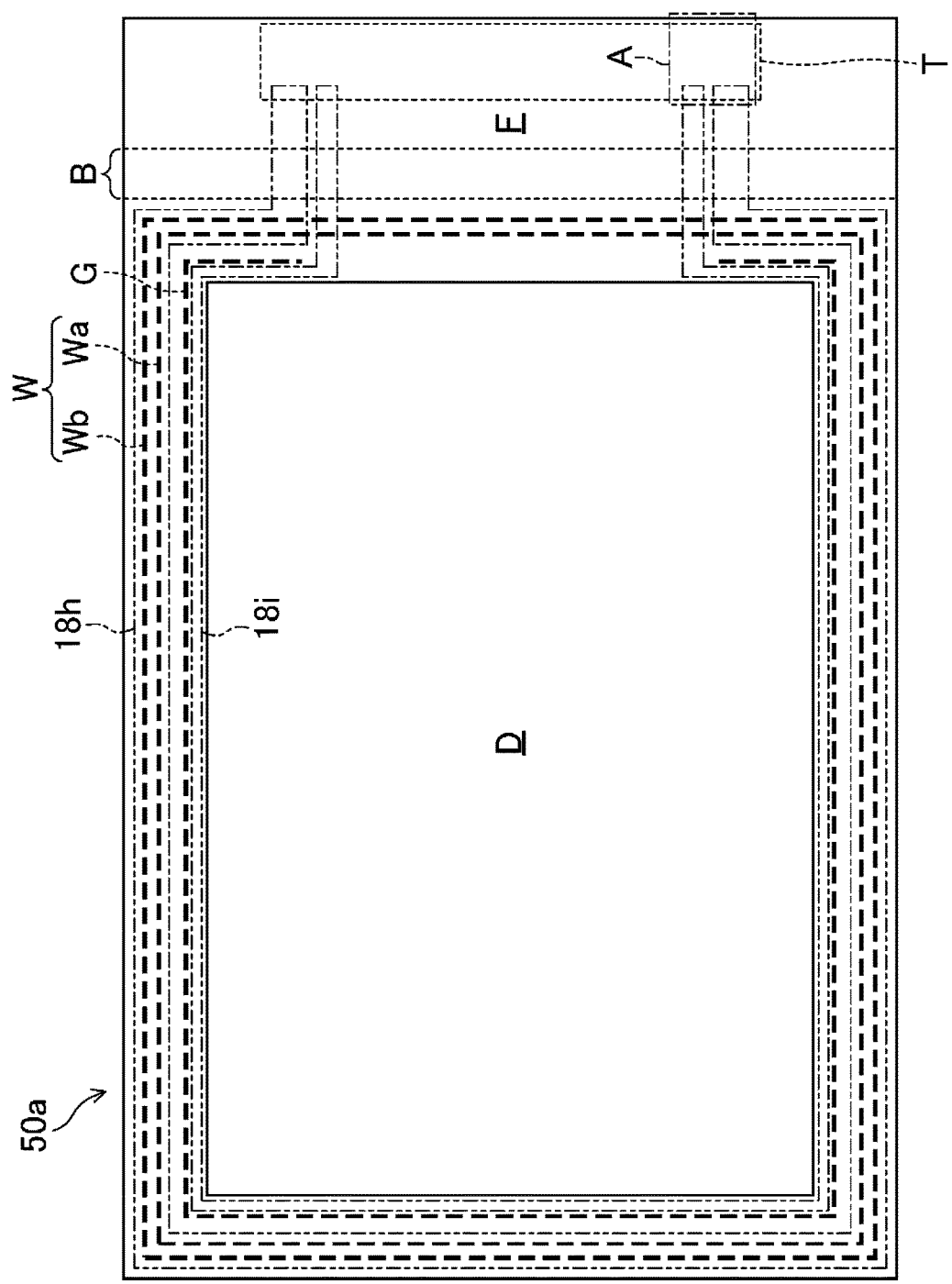
FIG. 9 is a plan view illustrating a first frame wiring line and a second frame wiring line disposed in a frame region of the organic EL display device according to the first embodiment of the disclosure.
Figure 10:
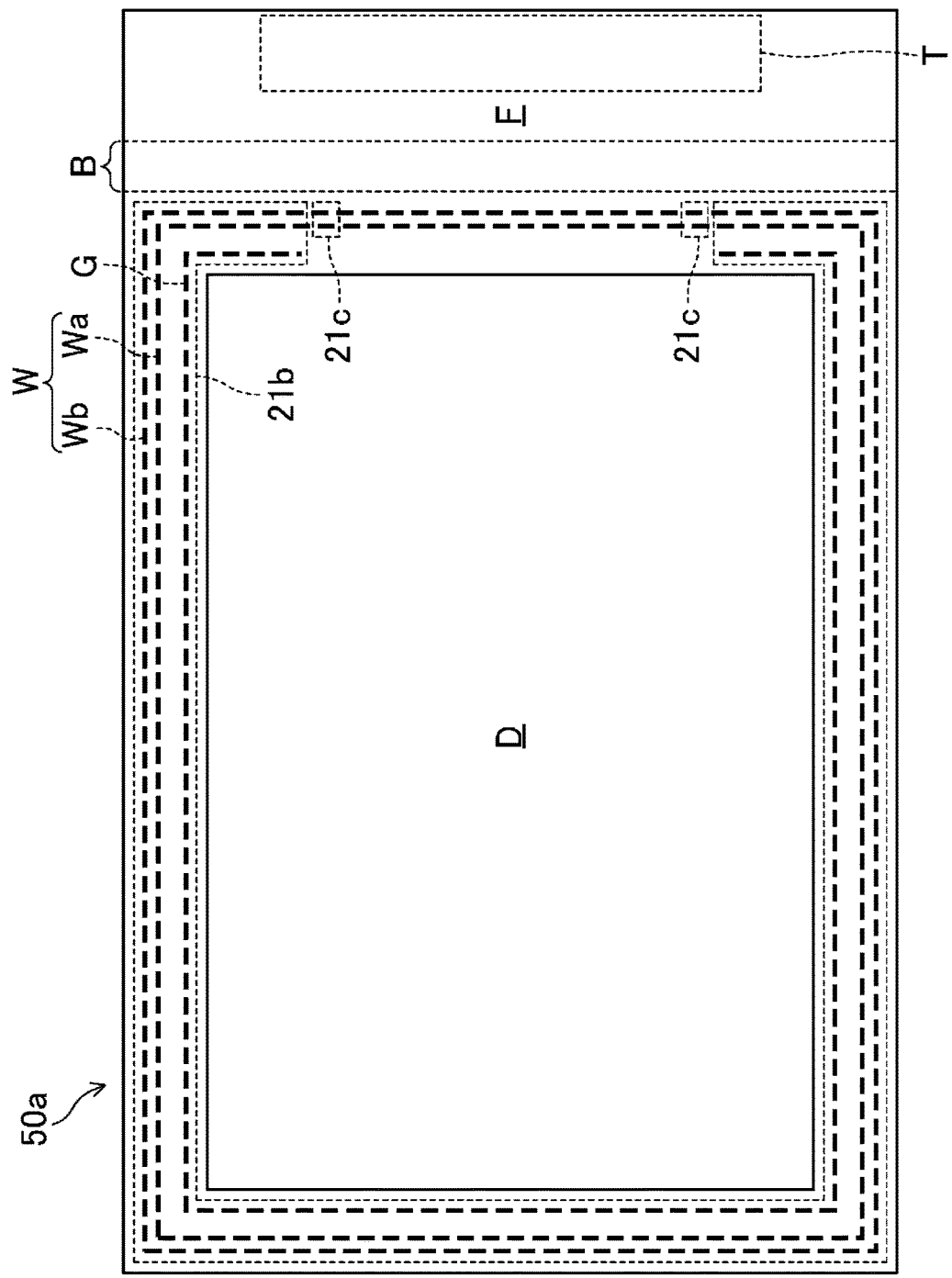
FIG. 10 is a plan view illustrating a first conductive layer and a second conductive layer disposed in a frame region of the organic EL display device according to the first embodiment of the disclosure.
Figure 11:
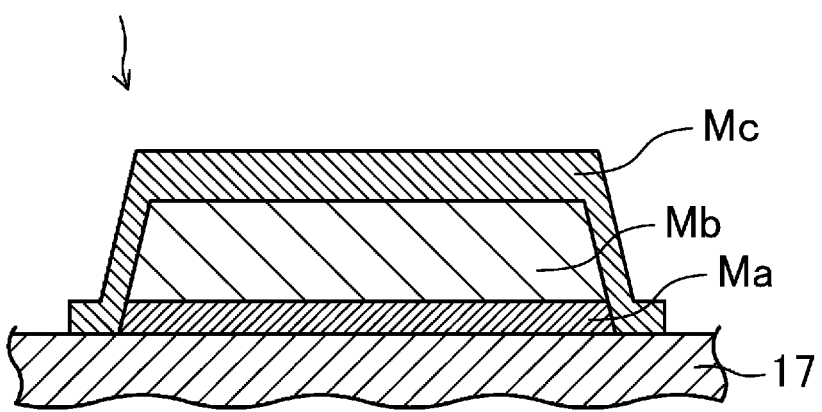
FIG. 11 is a transverse sectional view of a source line, a power source line, the first frame wiring line, and the second frame wiring line, which constitute the organic EL display device according to the first embodiment of the disclosure.
Figure 12:
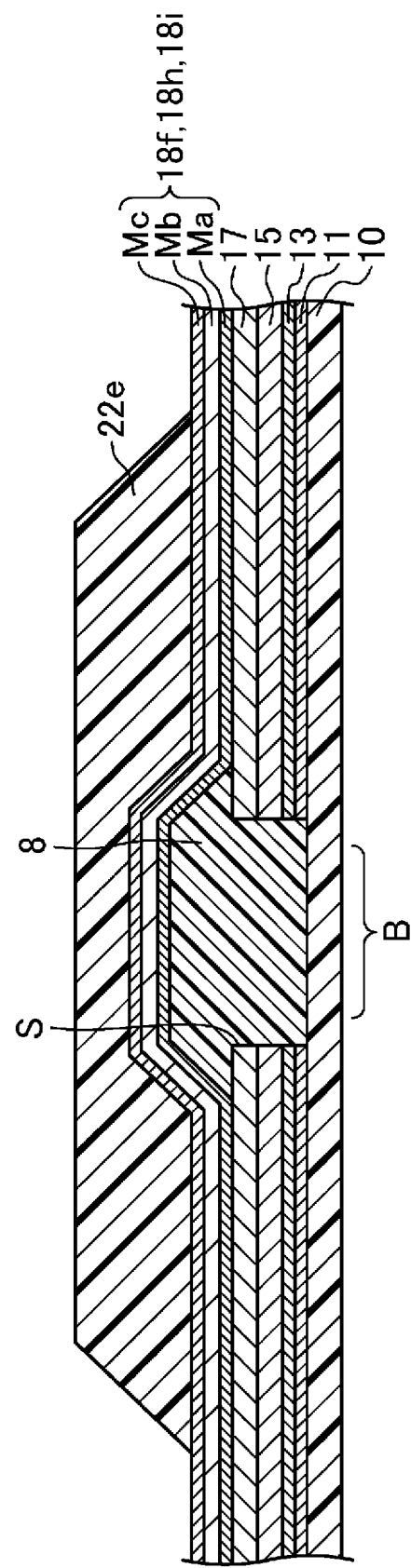
FIG. 12 is a cross-sectional view of a bending portion of a frame region of the organic EL display device taken along a line XII-XII in FIG. 1.
Figure 13:
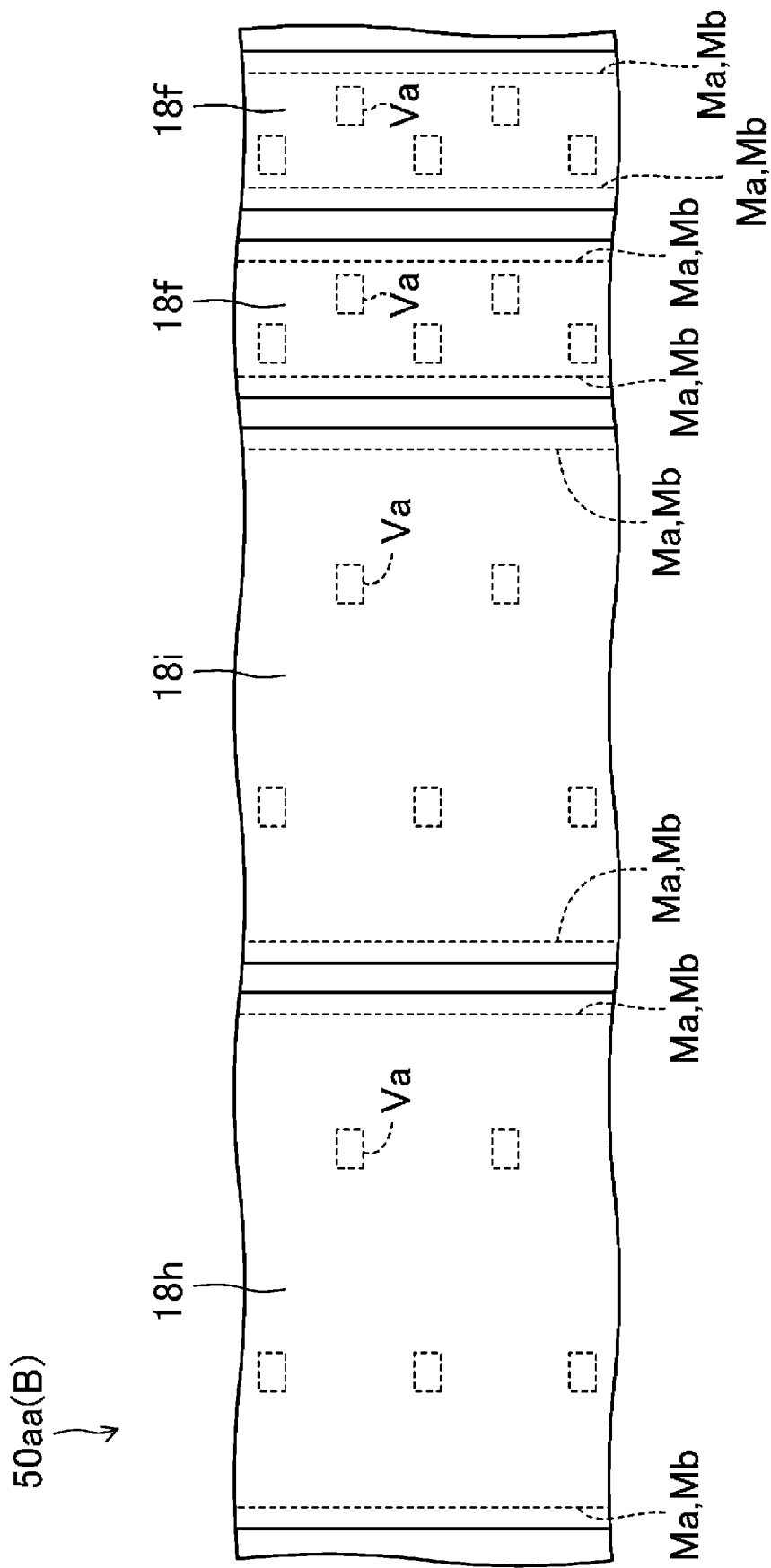
FIG. 13 is a plan view of a bending portion of a frame region in a first modification example of the organic EL display device according to the first embodiment of the disclosure.
Figure 14:
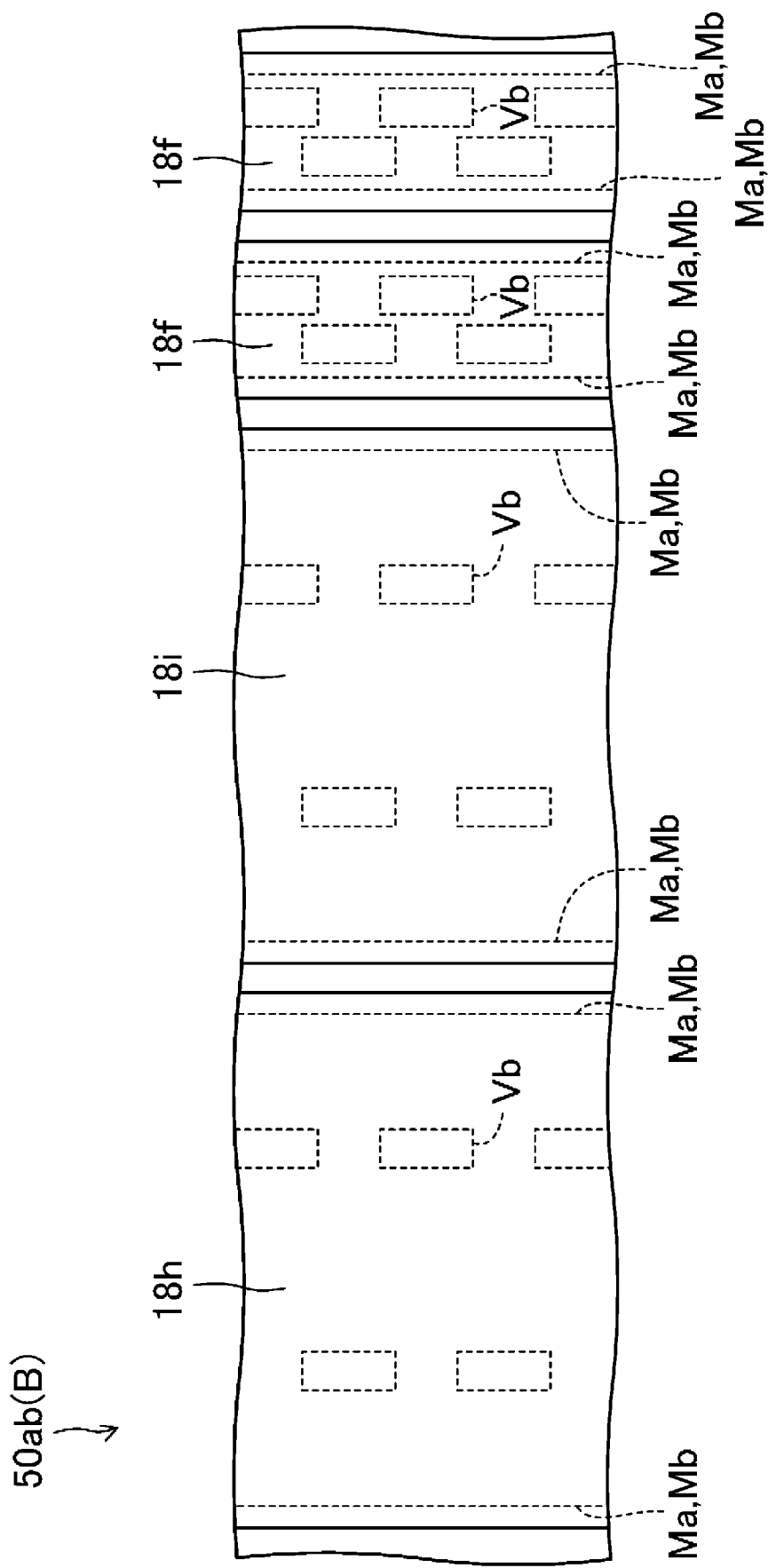
FIG. 14 is a plan view of a bending portion of a frame region in a second modification example of the organic EL display device according to the first embodiment of the disclosure.
Figure 15:
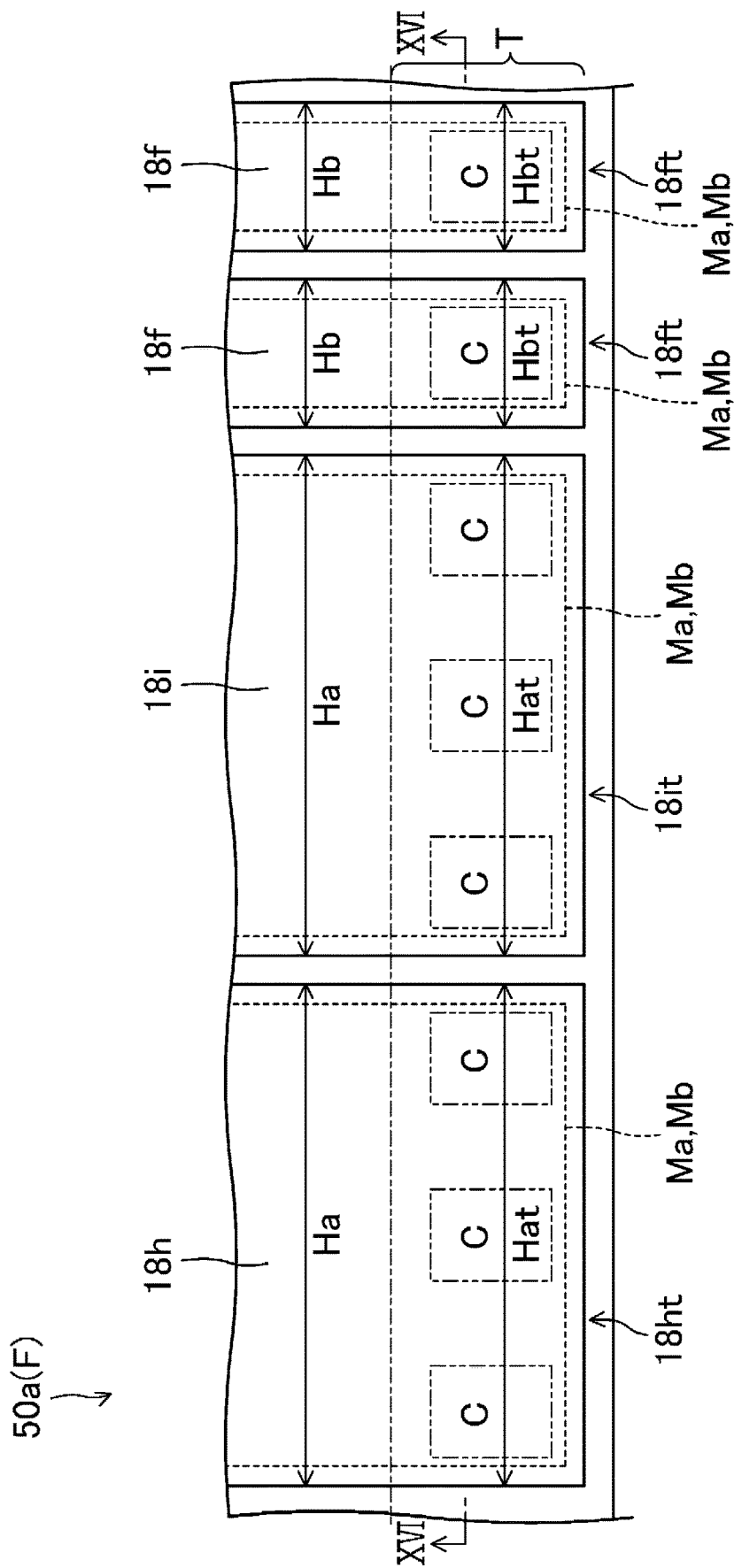
FIG. 15 is a plan view of a terminal portion of a frame region of the organic EL display device according to the first embodiment of the disclosure, in which a region A in FIG. 9 is enlarged.
Figure 16:
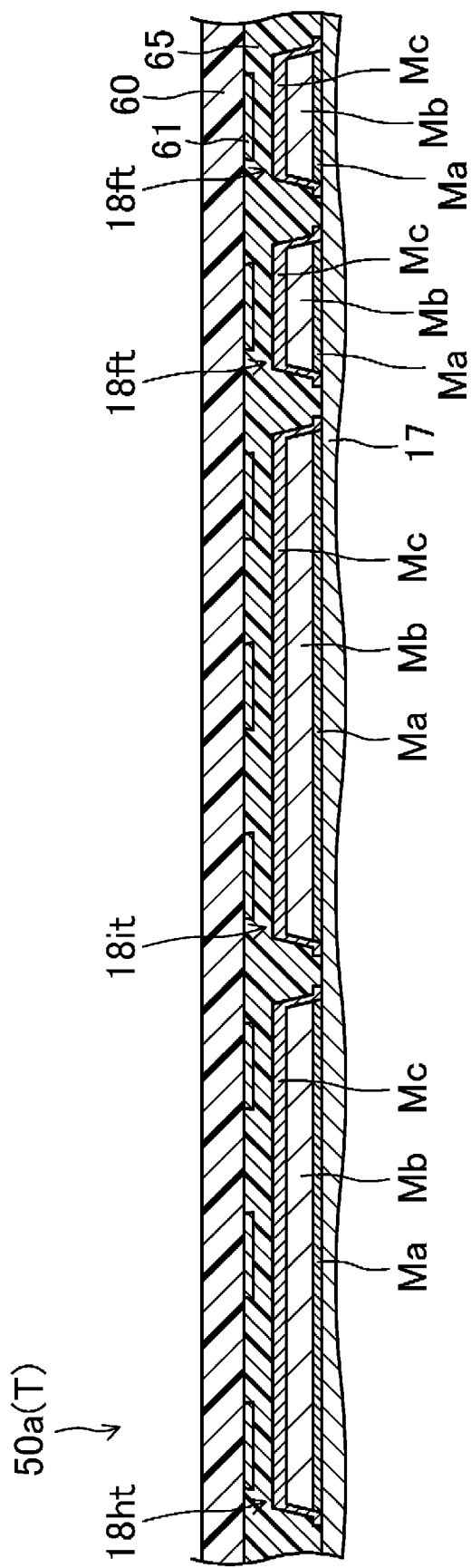
FIG. 16 is a cross-sectional view of a terminal portion of a frame region of the organic EL display device taken along a line XVI-XVI in FIG. 15.

FIG. 1 to FIG. 18 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. Additionally, FIG. 2 is a plan view of a display region D of the organic EL display device 50a. FIG. 3 is a cross-sectional view of the organic EL display device 50a taken along a line III-III in FIG. 1. FIG. 4 is an equivalent circuit diagram of a TFT layer 20 constituting the organic EL display device 50a. Further, FIG. 5 is a cross-sectional view of an organic EL layer 23 configuring the organic EL display device 50a. FIG. 6, FIG. 7, and FIG. 8 are cross-sectional views of a frame region F of the organic EL display device 50a taken along a line VI-VI, line VII-VII, and line VIII-VIII, respectively, in FIG. 1. FIG. 9 is a plan view illustrating a first frame wiring line 18h and a second frame wiring line 18i disposed in the frame region F of the organic EL display device 50a. FIG. 10 is a plan view illustrating a first conductive layer 21c and a second conductive layer 21b disposed in the frame region F of the organic EL display device 50a. FIG. 11 is a transverse sectional view of a source line 18f, a power source line 18g, the first frame wiring line 18h, and the second frame wiring line 18i, which constitute the organic EL display device 50a. FIG. 12 is a cross-sectional view of a bending portion B of the frame region F of the organic EL display device 50a taken along a line XII-XII in FIG. 1. FIG. 13 is a plan view of a bending portion B of a frame region F in an organic EL display device 50aa, which is a first modification example of the organic EL display device 50a. FIG. 14 is a plan view of a bending portion B of a frame region F in an organic EL display device 50ab, which is a second modification example of the organic EL display device 50a, and FIG. 15 is a plan view of a terminal portion T of the frame region F in the organic EL display device 50a, in which a region A in FIG. 9 is enlarged. FIG. 16 is a cross-sectional view of the terminal portion T of the frame region F in the organic EL display device 50a taken along a line XVI-XVI in FIG. 15.

As illustrated in FIG. 1, the organic EL display device 50a includes, for example, the display region D provided in a rectangular shape and configured to display an image, and the frame region F provided in a frame shape surrounding the display region D. In the present embodiment, the display region D having a rectangular shape is exemplified, and the rectangular shape includes substantially rectangular shapes, such as a shape whose sides are arc-shaped, a shape whose corners are arc-shaped, and a shape having a notch in part of a side thereof.

A plurality of subpixels P is disposed in a matrix shape in the display region D, as illustrated in FIG. 2. In addition, in the display region D, for example, a subpixel P including a red light-emitting region Lr configured to display a red color, a subpixel P including a green light-emitting region Lg configured to display a green color, and a subpixel P including a blue light-emitting region Lb configured to display a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

The terminal portion T is provided in an end portion of the frame region F on the right side in FIG. 1 in such a manner as to extend in one direction (a vertical direction in the figure). Additionally, as illustrated in FIG. 1, in the frame region F, the bending portion B bendable, for example, by 180 degrees (in a U-shape) about a bending axis that is the vertical direction in the figure is provided between the display region D and the terminal portion T, and extends in one direction (the vertical direction in the figure). A plurality of terminals (power supply terminals 18ht and 18it, signal terminals 18ft, and the like to be described below) is arranged in the terminal portion T along a direction in which the terminal portion T extends. As illustrated in FIGS. 1, 3, and 6, in the frame region F, a trench G having a substantially C shape is provided in a flattening film 19a to be described below in such a manner as to pass through the flattening film 19a. Here, as illustrated in FIG. 1, the trench G is provided in a substantially C shape with the terminal portion T side being open in a plan view.

As illustrated in FIG. 3 and FIGS. 6 to 8, the organic EL display device 50a includes a resin substrate layer 10 provided as a base substrate, a thin film transistor (TFT) layer 20 provided on the resin substrate layer 10, an organic EL element 25 provided as a light-emitting element constituting the display region D on the TFT layer 20, and a sealing film 30 provided to cover the organic EL element 25.

The resin substrate layer 10 is formed, for example, of a polyimide resin or the like.

As illustrated in FIG. 3, the TFT layer 20 includes a base coat film 11 provided on the resin substrate layer 10, a plurality of first TFTs 9a, a plurality of second TFTs 9b, and a plurality of capacitors 9c provided on the base coat film 11, and the flattening film 19a provided on each of the first TFTs 9a, each of the second TFTs 9b, and each of the capacitors 9c. Here, in the TFT layer 20, as illustrated in FIG. 2 and FIG. 4, a plurality of gate lines 14 is provided so as to extend parallel to each other in the lateral direction in the drawings. In the TFT layer 20, as illustrated in FIG. 2 and FIG. 4, a plurality of source lines 18f is provided as display wiring lines in such a manner as to extend parallel to each other in the vertical direction in the drawings. Further, in the TFT layer 20, as illustrated in FIG. 2 and FIG. 4, a plurality of power source lines 18g is provided as the display wiring lines in such a manner as to extend parallel to each other in the vertical direction in the drawings. Then, as illustrated in FIG. 2, each of the power source lines 18g is provided to be adjacent to each of the source lines 18f. As illustrated in FIG. 11, the source line 18f and the power source line 18g include a first metal layer Ma, a second metal layer Mb, and a third metal layer Mc layered in sequence on a second interlayer insulating film 17 to be described later, where the third metal layer Mc is provided to cover the side surface of the first metal layer Ma, and the side surface and the upper face of the second metal layer Mb. The first metal layer Ma and the third metal layer Mc are formed of a refractory metal material such as tungsten, tantalum, molybdenum, niobium, or titanium, and are suitably formed by a titanium film. The second metal layer Mb is formed of a metal material having electrical resistance lower than that of the first metal layer Ma and the third metal layer Mc, such as aluminum, copper, or silver, and is suitably formed by an aluminum film. Further, in the TFT layer 20, as illustrated in FIG. 4, each of the subpixels P includes the first TFT 9a, the second TFT 9b, and the capacitor 9c.

The base coat film 11 is formed of a single-layer film or a layered film of an inorganic insulating film made of, for example, silicon nitride, silicon oxide, silicon oxynitride, or the like.

The first TFT 9a is electrically connected to the corresponding gate line 14 and source line 18f in each of the subpixels P, as illustrated in FIG. 4. Additionally, as illustrated in FIG. 3, the first TFT 9a includes a semiconductor layer 12a, a gate insulating film 13, a gate electrode 14a, a first interlayer insulating film 15, the second interlayer insulating film 17, and a source electrode 18a and a drain electrode 18b, which are sequentially provided on the base coat film 11. As illustrated in FIG. 3, the semiconductor layer 12a is provided in an island shape with a polysilicon film on the base coat film 11, for example, and includes a channel region, a source region, and a drain region. Additionally, as illustrated in FIG. 3, the gate insulating film 13 is provided covering the semiconductor layer 12a. Additionally, as illustrated in FIG. 3, the gate electrode 14a is provided on the gate insulating film 13, and overlaps with the channel region of the semiconductor layer 12a. Additionally, as illustrated in FIG. 3, the first interlayer insulating film 15 and the second interlayer insulating film 17 are sequentially provided covering the gate electrode 14a. Additionally, as illustrated in FIG. 3, the source electrode 18a and the drain electrode 18b are provided being separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that the gate insulating film 13, the first interlayer insulating film 15, and the second interlayer insulating film 17 include a single-layer film or a layered film of an inorganic insulating film of, for example, silicon nitride, silicon oxide, or silicon oxynitride.

The second TFT 9b is electrically connected to the corresponding first TFT 9a and power source line 18g in each of the subpixels P, as illustrated in FIG. 4. As illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are sequentially provided on the base coat film 11. As illustrated in FIG. 3, the semiconductor layer 12b is provided in an island shape with a polysilicon film on the base coat film 11, for example, and includes a channel region, a source region, and a drain region. Additionally, as illustrated in FIG. 3, the gate insulating film 13 is provided covering the semiconductor layer 12b. Additionally, as illustrated in FIG. 3, the gate electrode 14b is provided on the gate insulating film 13, and overlaps with the channel region of the semiconductor layer 12b. Additionally, as illustrated in FIG. 3, the first interlayer insulating film 15 and the second interlayer insulating film 17 are sequentially provided covering the gate electrode 14b. Additionally, as illustrated in FIG. 3, the source electrode 18c and the drain electrode 18d are provided being separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as the gate electrodes 14a and 14b, the first interlayer insulating film 15 provided so as to cover the lower conductive layer 14c, and an upper conductive layer 16 provided on the first interlayer insulating film 15 so as to overlap with the lower conductive layer 14c. Note that, as illustrated in FIG. 3, the upper conductive layer 16 is electrically connected to the power source line 18g via a contact hole formed in the second interlayer insulating film 17.

The flattening film 19a is formed of, for example, an organic resin material, such as a polyimide resin.

The organic EL element 25 includes, as illustrated in FIG. 3, a plurality of first electrodes 21a, an edge cover 22a, a plurality of organic EL layers 23, and a second electrode 24, which are provided sequentially on the flattening film 19a.

The plurality of first electrodes 21a is provided in a matrix shape on the flattening film 19a to correspond to the plurality of subpixels P, as illustrated in FIG. 3. Further, as illustrated in FIG. 3, each of the first electrodes 21a is electrically connected to the drain electrode 18d of each of the second TFTs 9b via a contact hole formed in the flattening film 19a. The first electrode 21a functions to inject holes (positive holes) into the organic EL layer 23. The first electrode 21a is preferably formed of a material having a large work function to improve the efficiency of hole injection into the organic EL layer 23. Examples of materials constituting the first electrode 21a include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a may include an alloy of astatine (At)/astatine oxide ($AtO_2$) or the like. Examples of materials constituting the first electrode 21a may include electrically conductive oxides such as tin oxide (SnO), zinc oxide (ZnO), indium tin oxide (ITO), and indium zinc oxide (IZO). The first electrode 21a may be formed by layering a plurality of layers formed of any of the materials described above. Note that, examples of compound materials having a large work function include indium tin oxide (ITO) and indium zinc oxide (IZO).

The edge cover 22a is provided in a lattice shape to cover a peripheral portion of each first electrode 21a, as illustrated in FIG. 3. Examples of a material constituting the edge cover 22a include a positive-working photosensitive resin such as polyimide resin, acrylic resin, polysiloxane resin, and novolak resin. Further, as illustrated in FIG. 3, part of a surface of the edge cover 22a projects upward in the drawing and becomes a pixel photospacer provided in an island shape.

The plurality of organic EL layers 23 is disposed on each of the first electrodes 21a, and are provided in a matrix shape to correspond to the plurality of subpixels P, as illustrated in FIG. 3. As illustrated in FIG. 5, each of the organic EL layers 23 includes a hole injection layer 1, a hole transport layer 2, a light-emitting layer 3, an electron transport layer 4, and an electron injection layer 5, which are provided sequentially in that order over the first electrode 21a.

The hole injection layer 1 is also referred to as an anode buffer layer, and functions to reduce an energy level difference between the first electrode 21a and the organic EL layer 23 to thereby improve the efficiency of hole injection into the organic EL layer 23 from the first electrode 21a. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 21a to the organic EL layer 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21a and the second electrode 24, respectively, and the holes and the electrons recombine, when a voltage is applied via the first electrode 21a and the second electrode 24. Here, the light-emitting layer 3 is formed of a material having great light-emitting efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 3, the second electrode 24 is disposed to cover each of the organic EL layers 23 and the edge cover 22a. In addition, the second electrode 24 functions to inject electrons into the organic EL layer 23. In addition, the second electrode 24 is preferably formed of a material with a low work function to improve the efficiency of electron injection into the organic EL layer 23. Here, examples of materials that may be included in the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3 and FIGS. 6 to 8, the sealing film 30 includes a first inorganic insulating film 26 provided to cover the second electrode 24, an organic film 27 provided on the first inorganic insulating film 26, and a second inorganic insulating film 28 provided to cover the organic film 27, and functions to protect the organic EL layer 23 from moisture, oxygen, and the like. The first inorganic insulating film 26 and the second inorganic insulating film 28 are each formed of, for example, an inorganic material such as silicon oxide ($SiO_2$), aluminum oxide ($Al_2O_3$), silicon nitride (SiNx (x is a positive number)) such as trisilicon tetranitride ($Si_3N_4$), or silicon carbonitride (SiCN). The organic film 27 is formed of, for example, an organic material such as acrylic resin, polyurea resin, parylene resin, polyimide resin, or polyamide resin.

As illustrated in FIG. 1, the organic EL display device 50a includes, in the frame region F, a dam wall W provided to surround the display region D. As illustrated in FIG. 1, the dam wall W includes a first dam wall Wa provided in a frame shape to overlap with a circumferential end portion of the organic film 27 of the sealing film 30, and a second dam wall Wb provided in a frame shape around the first dam wall Wa.

As illustrated in FIG. 6, the first dam wall Wa is formed by sequentially layering a flattening film 19b formed of the same material and in the same layer as the flattening film 19a, a second conductive layer 21b to be described later, and a resin layer 22c formed of the same material and in the same layer as the edge cover 22a, on three sides (upper, left, and lower sides in FIG. 1) extending not along the terminal portion T of the frame region F. As illustrated in FIG. 7, the first dam wall Wa is formed by sequentially layering the flattening film 19b formed of the same material and in the same layer as the flattening film 19a, a first conductive layer 21c to be described later, and the resin layer 22c formed of the same material and in the same layer as the edge cover 22a, on part of one side (right side in FIG. 1) extending along the terminal portion T of the frame region F. As illustrated in FIG. 8, the first dam wall Wa is formed by sequentially layering the flattening film 19b formed of the same material and in the same layer as the flattening film 19a, and the resin layer 22c formed of the same material and in the same layer as the edge cover 22a, on another part of the one side (right side in FIG. 1) extending along the terminal portion T of the frame region F.

As illustrated in FIG. 6, the second dam wall Wb is formed by sequentially layering a flattening film 19c formed of the same material and in the same layer as the flattening film 19a, the second conductive layer 21b to be described later, and a resin layer 22d formed of the same material and in the same layer as the edge cover 22a, on the three sides (upper, left, and lower sides in FIG. 1) extending not along the terminal portion T of the frame region F. As illustrated in FIG. 7, the second dam wall Wb is formed by sequentially layering the flattening film 19c formed of the same material and in the same layer as the flattening film 19a, the first conductive layer 21c to be described later, and the resin layer 22d formed of the same material and in the same layer as the edge cover 22a, on part of the one side (right side in FIG. 1) extending along the terminal portion T of the frame region F. As illustrated in FIG. 8, the second dam wall Wb is formed by sequentially layering the flattening film 19c formed of the same material and in the same layer as the flattening film 19a, and the resin layer 22d formed of the same material and in the same layer as the edge cover 22a, on another part of the one side (right side in FIG. 1) extending along the terminal portion T of the frame region F.

As illustrated in FIGS. 3, 6, and 9, the organic EL display device 50a includes a first frame wiring line 18h provided in a substantially C shape outside of the trench G in such a manner as to surround the display region D and overlap with the first dam wall Wa and the second dam wall Wb in the frame region F. As illustrated in FIG. 6, in a plan view, the first frame wiring line 18h is provided across to the opposite side of the second dam wall Wb to the display region D, on the sides of the frame region F that do not face at least the terminal portion T, that is, on the three sides (upper, left, and lower sides in FIG. 1) including the sides of the frame region F (upper and lower sides in FIG. 1) that do not face the terminal portion T. The first frame wiring line 18h is electrically connected to, in the terminal portion T, the power supply terminal 18ht (see FIGS. 15 and 16) to be described below, to which a low power supply voltage (ELVSS) is input. Further as illustrated in FIG. 6, the first frame wiring line 18h is electrically connected to the second electrode 24 via the second conductive layer 21b to be described below. The first frame wiring line 18h is provided continuously across to the power supply terminal 18ht. As for the expression "provided continuously", there is a case in which a diode formed by a transistor is interposed between a terminal portion and a wiring line (near the terminal portion) to remove noise of an input signal, and such a case does not impair the object of the disclosure and is also included in the meaning of "provided continuously" of the disclosure. Further, the first frame wiring line 18h is formed of the same material and in the same layer as the source line 18f, and as illustrated in FIG. 11, the third metal layer Mc is provided to cover the side surface of the first metal layer Ma, and the side surface and upper face of the second metal layer Mb.

As illustrated in FIGS. 3, 6, and 10, the organic EL display device 50a includes the second conductive layer 21b provided in a substantially C shape in such a manner as to overlap with the trench G, the first dam wall Wa, and the second dam wall Wb in the frame region F. The second conductive layer 21b is formed of the same material and in the same layer as the first electrode 21a.

As illustrated in FIGS. 3, 7, and 9, the organic EL display device 50a includes a second frame wiring line 18i provided in a substantially C shape inside of the trench G in the frame region F. The second frame wiring line 18i is electrically connected to, in the terminal portion T, the power supply terminal 18it (see FIGS. 15 and 16) to be described below, to which a high power supply voltage (ELVDD) is input. The second frame wiring line 18i is electrically connected, on the display region D side, to the plurality of power source lines 18g disposed in the display region D. As illustrated in FIG. 7, the second frame wiring line 18i is electrically connected to the first conductive layer 21c to be described below between the flattening films 19a and 19b and between the flattening films 19b and 19c. The second frame wiring line 18i is provided continuously across to the power supply terminal 18it. Further, the second frame wiring line 18i is formed of the same material and in the same layer as the source line 18f, and as illustrated in FIG. 11, the third metal layer Mc is provided to cover the side surface of the first metal layer Ma, and the side surface and upper face of the second metal layer Mb. In FIG. 9, in a section extending toward the terminal portion T, the second frame wiring line 18*i* is illustrated to be thinner than the first frame wiring line 18*h*, but the first frame wiring line 18*h* and the second frame wiring line 18*i* may have the same width in the section extending toward the terminal portion T.

As illustrated in FIGS. 7 and 10, the organic EL display device 50*a* includes the first conductive layer 21*c* provided in an island shape in such a manner as to overlap with the first dam wall Wa and the second dam wall Wb in the frame region F. The first conductive layer 21*c* is formed of the same material and in the same layer as the first electrode 21*a*.

In the organic EL display device 50*a*, the plurality of source lines 18*f* is extended to the terminal portion T of the frame region F, and serve as a plurality of lead wiring lines (18*f*) electrically connected to the plurality of source lines 18*f* on the display region D side. The plurality of lead wiring lines (18*f*) is provided to extend parallel to each other in a direction orthogonal to the first dam wall Wa and the second dam wall Wb. The terminal portion T side of the plurality of lead wiring lines (18*f*) is electrically connected to, in the terminal portion T, the signal terminals 18*ft* (see FIGS. 15 and 16) to be described below, to which data signals are input. The lead wiring line (18*f*) is provided continuously across to the signal terminal 18*ft*, as illustrated in FIG. 8. The lead wiring line (18*f*), similar to the source line 18*f*, includes the first metal layer Ma, the second metal layer Mb, and the third metal layer Mc layered in sequence on the second interlayer insulating film 17, where the third metal layer Mc is provided to cover the side surface of the first metal layer Ma, and the side surface and upper face of the second metal layer Mb.

In the organic EL display device 50*a*, the plurality of power source lines 18*g* is extended to the terminal portion T of the frame region F, and serve as a plurality of lead wiring lines (18*g*) electrically connected to the plurality of power source lines 18*g* on the display region D side. The plurality of lead wiring lines (18*g*) is provided to extend parallel to each other in the direction orthogonal to the first dam wall Wa and the second dam wall Wb. The terminal portion T side of the plurality of lead wiring lines (18*g*) is electrically connected, in the terminal portion T via, for example, the second frame wiring line 18*i*, to the power supply terminal 18*it* (see FIGS. 15 and 16) to be described below, to which the high power supply voltage (ELVDD) is input. The lead wiring line (18*g*) is provided continuously across to the power supply terminal 18*it*. The lead wiring line (18*g*), similar to the power source line 18*g*, includes the first metal layer Ma, the second metal layer Mb, and the third metal layer Mc layered in sequence on the second interlayer insulating film 17, where the third metal layer Mc is provided to cover the side surface of the first metal layer Ma, and the side surface and upper face of the second metal layer Mb.

As illustrated in FIG. 12, the organic EL display device 50*a* includes, in the bending portion B of the frame region F, a frame flattening film 8 provided to be filled in a slit S formed in the base coat film 11, the gate insulating film 13, the first interlayer insulating film 15, and the second interlayer insulating film 17; and a wiring line protection layer 22*e* provided to cover the plurality of source lines 18*f* provided as the lead wiring lines on the frame flattening film 8 and the second interlayer insulating film 17, the first frame wiring line 18*h* and the second frame wiring line 18*i*, and each source line 18*f* as well as the first frame wiring line 18*h* and the second frame wiring line 18*i* in the bending portion B. As illustrated in FIG. 12, the slit S is provided to be formed in a groove shape that passes through the base coat film 11, the gate insulating film 13, the first interlayer insulating film 15 and the second interlayer insulating film 17, and proceeds along a direction in which the bending portion B extends so as to expose the upper face of the resin substrate layer 10. The frame flattening film 8 is formed of, for example, an organic resin material such as a polyimide resin. The plurality of source lines 18*f*, the first frame wiring line 18*h*, and the second frame wiring line 18*i* are provided to extend parallel to each other in a direction orthogonal to the direction in which the bending portion B extends. The wiring line protection layer 22*e* is formed of the same material and in the same layer as the edge cover 22*a*.

Each of the source lines 18*f*, the first frame wiring line 18*h*, and the second frame wiring line 18*i* disposed in the bending portion B may include a plurality of openings Va and Vb in the layered film of the first metal layer Ma and the second metal layer Mb, as illustrated in FIGS. 13 and 14.

Specifically, in the bending portion B of an organic EL display device 50*aa* illustrated in FIG. 13, in each source line 18*f*, and the first frame wiring line 18*h* and second frame wiring line 18*i*, the plurality of openings Va each passing through the first metal layer Ma and the second metal layer Mb is provided in a zig-zag shape in the first metal layer Ma and the second metal layer Mb, and the third metal layer Mc is provided to cover the plurality of openings Va. The plurality of openings Va is provided in two rows along the direction in which the bending portion B extends (the direction in which the first frame wiring line 18*h* and the second frame wiring line 18*i* are adjacent to each other), as illustrated in FIG. 13. The number of rows of the openings Va may be one, or three or more. The plurality of openings Va in different rows may overlap with each other in the extending direction of the bending portion B. The opening Va may have any planar shape such as, in addition to a rectangular shape as illustrated in the drawing, a triangular shape, a polygonal shape of more than a pentagon, an elliptical shape, or a star shape. According to the organic EL display device 50*aa*, the opening Va is formed in the second metal layer Mb with a film thickness greater than that of the first metal layer Ma and the third metal layer Mc, whereby stress generated in the bending portion B at the time of being bent may be alleviated. Even when a disconnection occurs in part of the first metal layer Ma and the second metal layer Mb, the disconnection stops at the opening Va, whereby the disconnections of the source line 18*f* itself, the first frame wiring line 18*h* itself, and the second frame wiring line 18*i* itself may be suppressed.

In the bending portion B of an organic EL display device 50*ab* illustrated in FIG. 14, in each source line 18*f*, and the first frame wiring line 18*h* and second frame wiring line 18*i*, the plurality of openings Vb each passing through the first metal layer Ma and the second metal layer Mb is provided in a zig-zag shape in the first metal layer Ma and the second metal layer Mb, and the third metal layer Mc is provided to cover the plurality of openings Vb. As illustrated in FIG. 14, the plurality of openings Vb is provided in two rows along the direction in which the bending portion B extends (the direction in which the first frame wiring line 18*h* and the second frame wiring line 18*i* are adjacent to each other), where the plurality of openings Vb of one of the rows is provided to overlap with the plurality of openings Vb of the other row in the direction in which the bending portion B extends. The number of rows of the openings Vb may be a plural number not less than three, and in that case, the plurality of openings Vb in any one of the rows among the plurality of openings Vb in the plurality of rows may be provided to overlap with the plurality of openings Vb in any one of the other rows among the plurality of openings Vb in the plurality of rows in the extending direction of the bending portion B. The opening Vb may have any planar shape such as, in addition to a rectangular shape as illustrated in the drawing, a triangular shape, a polygonal shape of more than a pentagon, an elliptical shape, or a star shape. According to the organic EL display device 50ab, the opening Vb is formed in the second metal layer Mb with a film thickness greater than that of the first metal layer Ma and the third metal layer Mc, whereby stress generated in the bending portion B at the time of being bent may be alleviated. Even when a disconnection occurs in part of the first metal layer Ma and the second metal layer Mb, the disconnection stops at the opening Vb, whereby the disconnections of the source line 18f itself, the first frame wiring line 18h itself, and the second frame wiring line 18i itself may be suppressed. Furthermore, although the second metal layer Mb with a thick film thickness is likely to be disconnected in the extending direction of the bending portion B, the plurality of openings Vb in the plurality of rows overlaps with each other in the extending direction of the bending portion B, whereby the disconnection may be stopped at any of the openings Vb.

As illustrated in FIGS. 3 and FIGS. 6 to 8, the organic EL display device 50a includes a plurality of peripheral photospacers 22b each provided in an island shape in such a manner as to project upward in the drawing, on the flattening film 19a in the frame region F. The peripheral photospacer 22b is formed of the same material and in the same layer as the edge cover 22a.

As illustrated in FIGS. 15 and 16, the organic EL display device 50a includes the power supply terminals 18ht and 18it and the plurality of signal terminals 18ft provided on the second interlayer insulating film 17, in the terminal portion T of the frame region F. As illustrated in FIG. 16, a flexible printed circuit (FPC) board 60 is pasted to the terminal portion T of the organic EL display device 50a via an electrically conductive paste 65.

As illustrated in FIGS. 9 and 15, the power supply terminals 18ht and 18it are provided in both end portions in the extending direction of the terminal portion T. The power supply terminal 18ht is electrically connected to the second electrode 24 via the first frame wiring line 18h having a wiring line width Ha (see FIG. 15). The power supply terminal 18it is electrically connected to the power source line 18g via the second frame wiring line 18i having the wiring line width Ha (see FIG. 15). As illustrated in FIG. 15, the power supply terminals 18ht and 18it having a terminal width Hat are wider in width than the signal terminal 18ft having a terminal width Hbt, and each include a plurality (for example, three) of contact regions C for electrically connecting to electrodes 61 arranged on the flexible printed circuit board 60. The power supply terminals 18ht and 18it are formed of the same material and in the same layer as the source line 18f, and as illustrated in FIG. 16, the third metal layer Mc is provided to cover the side surface of the first metal layer Ma, and the side surface and upper face of the second metal layer Mb. Further, in the power supply terminals 18ht and 18it, the upper face and the side surface of the third metal layer Mc are covered with the electrically conductive paste 65, as illustrated in FIG. 16.

The signal terminal 18ft is provided in an intermediate portion in the extending direction of the terminal portion T. The signal terminal 18ft is electrically connected to the source line 18f having the wiring line width Hb (<Ha, see FIG. 15). As illustrated in FIG. 15, the signal terminal 18ft includes one contact region C for electrically connecting to the electrode 61 arranged on the flexible printed circuit board 60. The signal terminal 18ft is covered with the electrically conductive paste 65, as illustrated in FIG. 16. As illustrated in FIG. 15, the lead wiring line (the source line 18f) having the wiring line width Hb and electrically connected to the signal terminal 18ft is provided to be thinner than the lead wiring lines (the first frame wiring line 18h and second frame wiring line 18i) having the wiring line width Ha and electrically connected to the power supply terminals 18ht and 18it. The signal terminal 18ft is formed of the same material and in the same layer as the source line 18f, and as illustrated in FIG. 16, the third metal layer Mc is provided to cover the side surface of the first metal layer Ma, and the side surface and upper face of the second metal layer Mb. Further, in the signal terminal 18ft, the upper face and the side surface of the third metal layer Mc are covered with the electrically conductive paste 65, as illustrated in FIG. 16.

Figure 17:
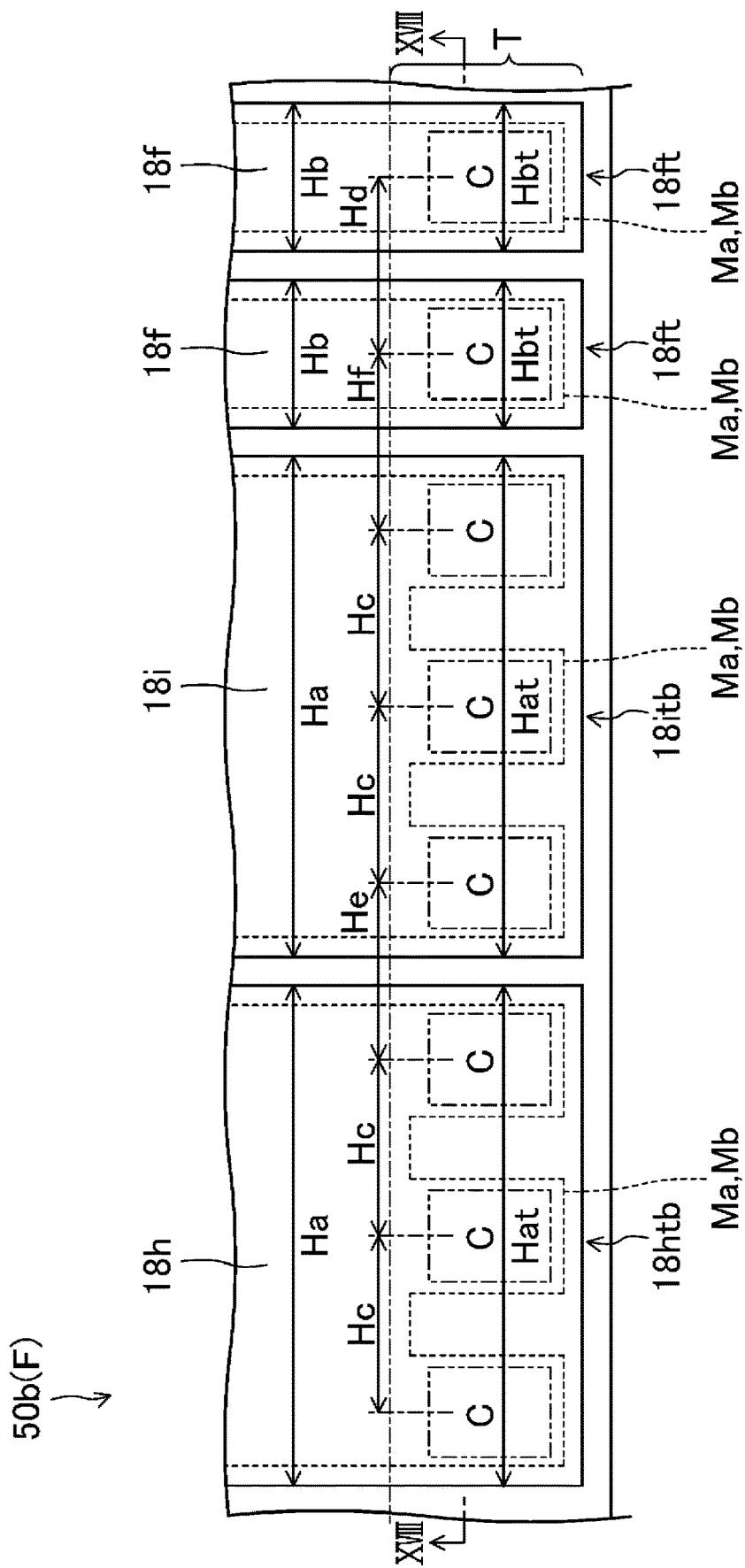
FIG. 17 is a plan view of a terminal portion of a frame region in a third modification example of the organic EL display device according to the first embodiment of the disclosure.
Figure 18:
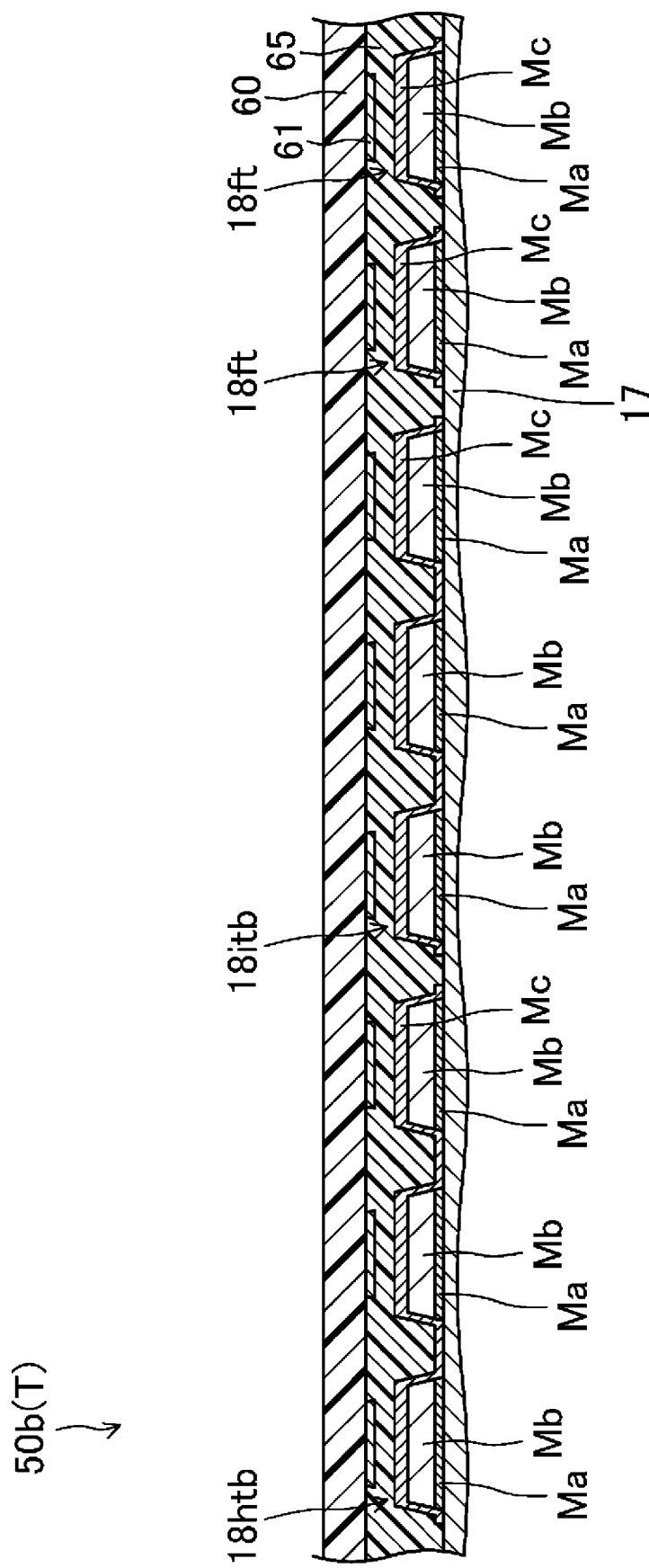
FIG. 18 is a cross-sectional view of a terminal portion of a frame region of the organic EL display device taken along a line XVIII-XVIII in FIG. 17.

In the present embodiment, the organic EL display device 50a is exemplified in which the power supply terminal 18ht (18it) with the first metal layer Ma and the second metal layer Mb being not split is provided in the terminal portion T, but an organic EL display device 50b may be employed in which a power supply terminal 18htb (18itb) with the first metal layer Ma and the second metal layer Mb being split into a plurality of sections is provided in the terminal portion T. FIG. 17 is a plan view of the terminal portion T of the frame region F in the organic EL display device 50b as a third modification example of the organic EL display device 50a, and is a view corresponding to FIG. 15. FIG. 18 is a cross-sectional view of the terminal portion T of the frame region F in the organic EL display device 50b taken along a line XVIII-XVIII in FIG. 17.

In the organic EL display device 50b, as illustrated in FIG. 17, in the power supply terminal 18htb, the first metal layer Ma and the second metal layer Mb are split from the lead wiring line (first frame wiring line 18h) into three sections, and in the power supply terminal 18itb, the first metal layer Ma and the second metal layer Mb are split from the lead wiring line (second frame wiring line 18i) into three sections. In the power supply terminal 18htb and the power supply terminal 18itb, as illustrated in FIG. 17, a pitch Hc of the split first and second metal layers Ma and Mb is equal to a pitch Hd of the signal terminal 18ft. In the power supply terminal 18htb and the power supply terminal 18itb, as illustrated in FIG. 17, each section of the split first metal layer Ma and second metal layer Mb includes one contact region C. In the power supply terminal 18htb and the power supply terminal 18itb, as illustrated in FIG. 17 and FIG. 18, the third metal layer Mc is provided to cover the side surface of the split first metal layer Ma and the side surface and upper face of the split second metal layer Mb, and cover a portion between the split first and second metal layers Ma and Mb and the split first and second metal layers Ma and Mb. The power supply terminal 18itb electrically connected to the power source line 18g and the power supply terminal 18htb electrically connected to the second electrode 24 are provided to be adjacent to each other, and a pitch He between the power supply terminals 18htb and 18itb is equal to the pitch Hd of the signal terminal 18ft. A pitch Hf between the power supply terminal 18itb of the power supply terminals 18htb and 18itb, and the signal terminal 18ft adjacent thereto is equal to the pitch Hd of the signal terminal 18ft. According to the organic EL display device 50b, the first metal layer Ma and the second metal layer Mb are split, and it is possible to sense a portion between the split first and second metal layers Ma and Mb and the split first and second metal layers Ma and Mb, and therefore it is possible to facilitate the alignment when the flexible printed circuit board 60 is mounted.

In the organic EL display device 50a described above, in each subpixel P, a gate signal is input to the first TFT 9a via the gate line 14 to turn on the first TFT 9a, a data signal is written in the gate electrode 14b of the second TFT 9b and the capacitor 9c via the source line 18f, and a current from the power source line 18g corresponding to the gate voltage of the second TFT 9b is supplied to the organic EL layer 23, whereby the light-emitting layer 3 of the organic EL layer 23 emits light to display an image. Note that in the organic EL display device 50a, even when the first TFT 9a is turned off, the gate voltage of the second TFT 9b is held by the capacitor 9c. Thus, the light emission by the light-emitting layer 3 is maintained until the gate signal of the next frame is input.

Next, a manufacturing method for the organic EL display device 50a according to the present embodiment will be described. Note that the manufacturing method for the organic EL display device 50a according to the present embodiment includes a TFT layer forming process, an organic EL element forming process, and a sealing film forming process.

TFT Layer Forming Process

For example, by using a known method, the TFT layer 20 is formed by forming the base coat film 11, the first TFT 9a, the second TFT 9b, the capacitor 9c, and the flattening film 19a on a surface of the resin substrate layer 10, which is formed on a glass substrate.

When the source line 18f, the power source line 18g, and the like are formed at the same time when the source electrode 18a, the drain electrode 18b, and the like of the first TFT 9a are formed, for example, a titanium film and an aluminum film may be sequentially film-formed first to cover the second interlayer insulating film 17, and thereafter the layered film of the titanium film and the aluminum film may be patterned to form the first metal layer Ma and the second metal layer Mb; subsequently a titanium film may be film-formed to cover the first metal layer Ma and the second metal layer Mb, and then the third metal layer Mc may be formed by patterning the titanium film. Note that the photomask used in forming the first metal layer Ma and the second metal layer Mb may differ from the photomask used in forming the third metal layer Mc; however, the photomask used in forming the first metal layer Ma and the second metal layer Mb may also be used as the photomask in forming the third metal layer Mc, for example, by causing the intensity of the exposure for the resist performed when forming the third metal layer Mc to be lower than the intensity of the exposure for the resist performed when forming the first metal layer Ma and the second metal layer Mb.

Organic EL Element Forming Process

The organic EL element 25 is formed by forming the first electrode 21a, the edge cover 22a, the organic EL layer 23 (the hole injection layer 1, the hole transport layer 2, the light-emitting layer 3, the electron transport layer 4, the electron injection layer 5), and the second electrode 24 on the flattening film 19a of the TFT layer 20 having been formed in the TFT layer forming process, by using a known method.

Sealing Film Forming Process

First, an inorganic insulating film such as a silicon nitride film, a silicon oxide film, or a silicon oxynitride film is film-formed by a plasma CVD method on a substrate surface where the organic EL element 25 has been formed in the organic EL element forming process, by using a mask to form the first inorganic insulating film 26.

Next, on the substrate surface where the first inorganic insulating film 26 is formed, an organic resin material such as an acrylic resin is film-formed by using, for example, an ink-jet method to form the organic film 27.

Further, an inorganic insulating film such as a silicon nitride film, a silicon oxide film, or a silicon oxynitride film is film-formed by a plasma CVD method on the substrate where the organic film 27 is formed, by using a mask to form the second inorganic insulating film 28, thereby forming the sealing film 30.

Finally, a protective film (not illustrated) is pasted onto the substrate surface where the sealing film 30 is formed, and thereafter a laser beam is radiated from the glass substrate side of the base substrate 10 to peel off the glass substrate from the lower face of the base substrate 10; further, a protective film (not illustrated) is pasted on the lower face of the base substrate 10, from which the glass substrate has been peeled off.

The organic EL display device 50a of the present embodiment can be manufactured in this manner.

As described above, according to the organic EL display device 50a of the present embodiment, in each lead wiring line (18f and 18g) in which the first metal layer Ma, the second metal layer Mb, and the third metal layer Mc are sequentially layered, the third metal layer Mc formed of a titanium film is provided to cover the side surface of the first metal layer Ma formed of a titanium film and the side surface and the upper face of the second metal layer Mb formed of an aluminum film. Therefore, each lead wiring line (18f and 18g) is unlikely to be damaged by the developing solution used in forming the flattening film 19a, the etching solution used when forming the first electrode 21a, and the developing solution used in forming the edge cover 22a. Thus, since each lead wiring line (18f and 18g) is unlikely to be damaged in the process of forming the flattening film 19a, the process of forming the first electrode 21a, and the process of forming the edge cover 22a, it is possible to suppress a situation in which the lead wiring lines (18f and 18g) are damaged during the manufacturing process. Moreover, since the situation in which the lead wiring lines (18f and 18g) are damaged during the manufacturing process is suppressed, an end portion of a transverse sectional shape of each lead wiring line (18f and 18g) is unlikely to be formed in an eaves shape; this makes it possible to suppress a situation in which moisture enters the display region D along each lead wiring line (18f and 18g), and thus suppress the deterioration of the organic EL layer 23 and the organic EL element 25 provided therewith.

According to the organic EL display device 50a of the present embodiment, since the lead wiring line (18f) of the source line 18f is provided continuously across to the signal terminal 18ft while being orthogonal to the first dam wall Wa, the second dam wall Wb, and the bending portion B, the electrical resistance of the source line 18f can be lowered in comparison with a case in which the lead wiring line is reconnected to another wiring line that is formed of the same material and in the same layer as the gate line 14 or the upper conductive layer 16, for example.

Further, according to the organic EL display device 50a of the present embodiment, in the first frame wiring line 18h, the third metal layer Mc formed of a titanium film is provided to cover the side surface of the first metal layer Ma formed of a titanium film, and the side surface and upper face of the second metal layer Mb formed of an aluminum film. With this, the first frame wiring line 18h can be provided across to the opposite side of the second dam wall Wb to the display region D on the three sides of the frame region F, any of which does not extend along the terminal portion T, and the width of the first frame wiring line 18h is widened, thereby making it possible to lower the electrical resistance of the first frame wiring line 18h.

According to the organic EL display device 50a of the present embodiment, in the power supply terminals 18ht and 18it and the signal terminal 18ft, the third metal layer Mc formed of a titanium film is provided to cover the side surface of the first metal layer Ma formed of a titanium film, and the side surface and upper face of the second metal layer Mb formed of an aluminum film, and the electrically conductive paste 65 covers the power supply terminals 18ht and 18it and the signal terminal 18ft. Therefore, there is no need to cover the power supply terminals 18ht and 18it and the signal terminal 18ft with a resin layer, and it is possible to suppress the occurrence of a contact failure with respect to the flexible printed circuit board 60.

According to the organic EL display device 50a of the present embodiment, since the power supply terminals 18ht and 18it are wider in width than the signal terminal 18ft, and includes the plurality of contact regions C, it is possible to suppress an increase in contact resistance even when the position of the electrode 61 of the flexible printed circuit board 60 is shifted from the position of the contact region C of the power supply terminals 18ht and 18it.

OTHER EMBODIMENTS

In each of the embodiments described above, the organic EL layer having a five-layer structure including the hole injection layer, the hole transport layer, the light-emitting layer, the electron transport layer, and the electron injection layer is exemplified. The organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device in which the layered structure of the organic EL layer is in a reverse order with the first electrode being a cathode and the second electrode being an anode.

In the above-described embodiments, the example of the organic EL display device in which the electrode of the TFT connected to the first electrode serves as the drain electrode is given. However, the disclosure is also applicable to an organic EL display device in which the electrode of the TFT connected to the first electrode is referred to as the source electrode.

In each of the embodiments described above, the organic EL display device is exemplified and described as a display device. The disclosure is also applicable to a display device including a plurality of light-emitting elements that is driven by an electrical current. For example, the disclosure is applicable to a display device including Quantum-dot Light Emitting Diodes (QLEDs) that are light-emitting elements using a quantum dot-containing layer.

INDUSTRIAL APPLICABILITY

As described above, the disclosure is useful for a flexible display device.

The invention claimed is:
1. A display device comprising:
a base substrate;
a thin film transistor (TFT) layer provided on the base substrate;
a plurality of light-emitting elements which are provided on the TFT layer, and in which a plurality of first electrodes, a plurality of light-emitting layers, and a second electrode common to the plurality of first electrodes are layered in sequence to form a display region;
a sealing film which is provided to cover the plurality of light-emitting elements, and in which a first inorganic insulating film, an organic film, and a second inorganic insulating film are layered in sequence;
a dam wall that is provided in a frame shape in a frame region around the display region, that surrounds the display region and overlaps with a circumferential end portion of the organic film;
a terminal portion which is provided in an end portion of the frame region in such a manner as to extend in one direction, and in which a plurality of terminals are arranged;
a plurality of display wiring lines in which display wiring lines extend parallel to each other in the display region, each of the plurality of display wiring lines including a first metal layer, a second metal layer, and a third metal layer that are layered in sequence, and the third metal layer is provided to cover a side surface of the first metal layer, and a side surface and an upper face of the second metal layer; and
a plurality of lead wiring lines that are provided in the frame region to intersect with the dam wall, lead wiring lines in the plurality of lead wiring lines extending parallel to each other, wherein each of the plurality of lead wiring lines:
is formed of a same material and in a same layer as each of the plurality of display wiring lines,
is electrically connected to a corresponding one of the plurality of display wiring lines on a display region side, and
is electrically connected to a corresponding one of the plurality of terminals on a terminal portion side, and
wherein a plurality of source lines and a plurality of power source lines are provided as the plurality of display wiring lines,
the third metal layer is provided to cover the side surface of the first metal layer, and the side surface and the upper face of the second metal layer in each of the plurality of lead wiring lines,
a bending portion is provided to extend in one direction between the display region and the terminal portion,
the plurality of lead wiring lines are provided to intersect with the bending portion,
in each of the plurality of lead wiring lines in the bending portion, a plurality of openings each passing through the first metal layer and the second metal layer is provided in the first metal layer and the second metal layer, and the third metal layer is provided to cover the plurality of openings, and
a thickness of the second metal layer is greater than each of a thickness of the first metal layer and a thickness of the third metal layer.
2. The display device according to claim 1, wherein the plurality of lead wiring lines is electrically connected to the plurality of source lines.

3. The display device according to claim 2,
wherein the plurality of lead wiring lines is electrically connected to the plurality of power source lines.

4. The display device according to claim 3,
wherein the plurality of lead wiring lines that are electrically connected to the plurality of power source lines are in contact with a first conductive layer that is provided to overlap with the dam wall and is formed of a same material as the plurality of first electrodes.

5. The display device according to claim 1,
wherein the dam wall includes a first dam wall that is provided in a frame shape on the display region side and that overlaps with the circumferential end portion of the organic film, and a second dam wall provided in a frame shape around the first dam wall, and
each of the plurality of lead wiring lines is provided to intersect with the first dam wall and the second dam wall.

6. The display device according to claim 5,
wherein the frame region is provided in a rectangular frame shape,
in the frame region, a second conductive layer that is formed of a same material as each of the plurality of first electrodes is provided to overlap with the first dam wall and the second dam wall,
in the frame region, a first frame wiring line that is formed of a same material as each of the plurality of display wiring lines is provided in such a manner as to surround the display region and overlap with the first dam wall and the second dam wall, and is electrically connected to the second electrode via the second conductive layer,
the first frame wiring line is provided across a side of the second dam wall opposite the display region at least on a side of the frame region that does not face the terminal portion in a plan view, and
in the first frame wiring line, the third metal layer is provided to cover the side surface of the first metal layer, and the side surface and the upper face of the second metal layer.

7. The display device according to claim 1,
wherein the plurality of terminals are formed of a same material and in a same layer as each of the plurality of display wiring lines, and
in each of the plurality of terminals, the third metal layer is provided to cover the side surface of the first metal layer, and the side surface and the upper face of the second metal layer.

8. The display device according to claim 7,
wherein a flexible printed circuit board is pasted to the terminal portion via an electrically conductive paste, and
an upper face and a side surface of the third metal layer are covered with the electrically conductive paste in each of the plurality of terminals.

9. The display device according to claim 1,
wherein the plurality of lead wiring lines are provided continuously across to the corresponding terminals.

10. The display device according to claim 8,
wherein a pair of power supply terminals are electrically connected to the power source line and the second electrode, respectively, is provided in both end portions of the terminal portion in a direction in which the terminal portion extends, and
a signal terminal electrically connected to the source line is provided in an intermediate portion in the direction in which the terminal portion extends.

11. The display device according to claim 10,
wherein a lead wiring line electrically connected to the signal terminal is provided to be thinner than the plurality of lead wiring lines electrically connected to the pair of power supply terminals.

12. The display device according to claim 10,
wherein the pair of power supply terminals is wider in width than the signal terminal and includes a plurality of contact regions for being electrically connected with the flexible printed circuit board.

13. The display device according to claim 10,
wherein the first metal layer and the second metal layer are split into a plurality of sections from a respective lead wiring line in the pair of power supply terminals, and
in the pair of power supply terminals, the third metal layer is provided to cover at least one side surface of the split first metal layer, and at least one side surface and an upper face of the split second metal layer in one of the plurality of split sections, and to cover a portion between one of the plurality of split sections and another one of the plurality of split sections.

14. The display device according to claim 13,
wherein a pitch of one of the plurality of split sections is equal to a pitch of the signal terminal.

15. The display device according to claim 14,
wherein one power supply terminal electrically connected to the power source line and the other power supply terminal electrically connected to the second electrode are provided to be adjacent to each other, and
a pitch between the one power supply terminal and the other power supply terminal is equal to the pitch of the signal terminal.

16. The display device according to claim 14,
wherein a pitch between the pair of power supply terminals and the signal terminal adjacent to the pair of power supply terminals is equal to the pitch of the signal terminal.

17. The display device according to claim 1,
wherein a plurality of rows of the plurality of openings is provided along the direction in which the bending portion extends, and
the plurality of openings in any one of the plurality of rows is provided with the plurality of openings in any other one of the plurality of rows being separated in a direction parallel to each other and being shifted in a length direction of the wiring for different rows that are in the direction in which the bending portion extends.

18. The display device according to claim 1,
wherein the first metal layer and the third metal layer are each formed of a titanium film, and
the second metal layer is formed of an aluminum film.

* * * * *